(12) United States Patent
Sekikawa et al.

(10) Patent No.: US 11,329,152 B2
(45) Date of Patent: May 10, 2022

(54) SEMICONDUCTOR DEVICE AND METHOD OF MANUFACTURING SEMICONDUCTOR DEVICE

(71) Applicant: RENESAS ELECTRONICS CORPORATION, Tokyo (JP)

(72) Inventors: Hiroaki Sekikawa, Tokyo (JP); Takahiro Mori, Ibaraki (JP); Yuji Ishii, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 283 days.

(21) Appl. No.: 16/375,634

(22) Filed: Apr. 4, 2019

(65) Prior Publication Data

US 2019/0326434 A1    Oct. 24, 2019

(30) Foreign Application Priority Data

Apr. 24, 2018    (JP) .............................. JP2018-082685

(51) Int. Cl.
*H01L 29/78*    (2006.01)
*H01L 29/10*    (2006.01)
(Continued)

(52) U.S. Cl.
CPC ...... *H01L 29/7816* (2013.01); *H01L 21/0337* (2013.01); *H01L 21/266* (2013.01);
(Continued)

(58) Field of Classification Search
CPC .......... H01L 29/66537; H01L 29/0619; H01L 29/7816; H01L 21/0337; H01L 21/266;
(Continued)

(56) References Cited

U.S. PATENT DOCUMENTS 5,248,894 A * 9/1993 Beasom ................ H01L 21/762
257/511
10,340,338 B2 * 7/2019 Mori ................... H01L 29/0653
(Continued)

FOREIGN PATENT DOCUMENTS

JP    2009-130021 A    6/2009
JP    2010-186878 A    8/2010

OTHER PUBLICATIONS

Japanese Notice of Reason for Refusal issued in corresponding Japanese Patent Application No. 2018-082684, dated Sep. 21, 2021, with English translation.

*Primary Examiner* — Shahed Ahmed
*Assistant Examiner* — Sun Mi Kim King
(74) *Attorney, Agent, or Firm* — McDermott Will & Emery LLP

(57) ABSTRACT

A method of manufacturing a semiconductor device of one embodiment includes the steps of: forming a drift region in a first surface of a semiconductor substrate; forming a body region having a first portion disposed in the first surface, and a second portion disposed in the first surface so as to surround the first portion and the drift region; forming a hard mask, having an opening over the drift region, in the first surface; forming a reverse conductivity region in the first surface by ion implantation using the hard mask; forming a trench in the first surface by anisotropic etching using the hard mask; and embedding an isolation film in the trench. The ion implantation is performed obliquely to the first surface such that ions are implanted below a first edge part, which is located on a first portion side of the opening, of the hard mask.

8 Claims, 18 Drawing Sheets

(51) Int. Cl.
*H01L 29/08* (2006.01)
*H01L 29/06* (2006.01)
*H01L 21/308* (2006.01)
*H01L 21/266* (2006.01)
*H01L 29/66* (2006.01)
*H01L 21/033* (2006.01)

(52) U.S. Cl.
CPC ...... *H01L 21/3086* (2013.01); *H01L 29/0649* (2013.01); *H01L 29/0865* (2013.01); *H01L 29/0882* (2013.01); *H01L 29/1095* (2013.01); *H01L 29/66681* (2013.01)

(58) Field of Classification Search
CPC ............. H01L 21/3086; H01L 29/0649; H01L 29/0865; H01L 29/0882; H01L 29/1095; H01L 29/66681; H01L 29/063; H01L 29/0653; H01L 29/1045; H01L 29/665; H01L 29/0847; H01L 29/66659; H01L 29/7835; H01L 21/26586
See application file for complete search history.

(56) References Cited

U.S. PATENT DOCUMENTS

| | | | |
|---|---|---|---|
| 2013/0187226 A1* | 7/2013 | Park | H01L 29/66659 257/343 |
| 2014/0054694 A1* | 2/2014 | Min | H01L 29/66659 257/336 |
| 2016/0284801 A1* | 9/2016 | Mori | H01L 29/1083 |

* cited by examiner

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2018-082685 filed on Apr. 24, 2018 including the specification, drawings and abstract is incorporated herein by reference in its entirety.

BACKGROUND

The present invention relates to a semiconductor device and a method of manufacturing the semiconductor device.

There has been known a semiconductor device as described in Japanese Unexamined Patent Application Publication No. 2009-130021.

The semiconductor device described in Japanese Unexamined Patent Application Publication No. 2009-130021 includes a substrate, a gate oxide layer, a LOCOS (local oxidation of silicon) oxide layer, and a gate polycide electrode. The substrate has a first surface.

The substrate includes an $n^+$ source region, an $n^+$ drain region, a $p^+$ diffusion layer, a $p^-$ body region, and an $n^-$ drift region. The $n^+$ source region, the $n^+$ drain region, and the $p^+$ diffusion layer are formed in the first surface. The $p^-$ body region is formed in the first surface so as to surround the $n^+$ source region. The $n^-$ drift region is formed in the first surface so as to surround the $n^+$ drain region and the $p^+$ diffusion layer and sandwich the $p^-$ body region between the $n^-$ drift region and the $n^+$ source region.

The gate oxide layer is formed over the $p^-$ body region sandwiched by the $n^+$ source region and the $n^-$ drift region. The LOCOS oxide layer is formed in the first surface so as to be sandwiched by the $n^+$ drain region and the $p^+$ diffusion layer. The gate polycide electrode is formed over the gate oxide layer.

SUMMARY

In the semiconductor device described in Japanese Unexamined Patent Application Publication No. 2009-130021, the $p^+$ diffusion layer can be formed by ion implantation with a photoresist as a mask, for example. In such a case, however, if an opening of the photoresist is formed out of alignment, width of the $p^+$ diffusion layer may increase in a channel length direction. Such an increase in width of the $p^+$ diffusion layer in the channel length direction results in an increase in on resistance of a laterally diffused metal oxide semiconductor (LDMOS) transistor configured by the $n^+$ source region, the $n^+$ drain region, the $p^-$ body region, the $n^-$ drift region, a gate oxide layer, and the gate polycide electrode.

Other objects and novel features will be clarified from the description of this specification and the accompanying drawings.

A method of manufacturing a semiconductor device of one embodiment includes the steps of: forming a drift region; forming a body region; forming a hard mask; forming a reverse conductivity region; forming a trench; embedding an isolation film in the trench; forming a source region; and forming a drain region.

The drift region is formed in a first surface of a semiconductor substrate. The body region has a first portion disposed in the first surface, and a second portion disposed in the first surface so as to surround the first portion and the drift region. The hard mask is formed over the first surface while having an opening over the drift region. The reverse conductivity region is formed in the first surface by ion implantation using the hard mask. The trench is formed in the first surface by anisotropic etching using the hard mask. The source region is formed in the first surface so as to be surrounded by the body region. The drain region is formed in the first surface so as to be surrounded by the drift region.

The ion implantation is performed obliquely to the first surface such that ions are implanted below a first edge part, which is located on a first portion side of the opening, of the hard mask. The body region and the reverse conductivity region have a common conductivity type opposite to a conductivity type common to the source region, the drain region, and the drift region.

According to the semiconductor device of the one embodiment, since the reverse conductivity region can be formed in a self-aligning manner, it is possible to suppress formation of the reverse conductivity region with its width increased in the channel length direction, and thus suppress an increase in on resistance.

DETAILED DESCRIPTION

Figure 1:
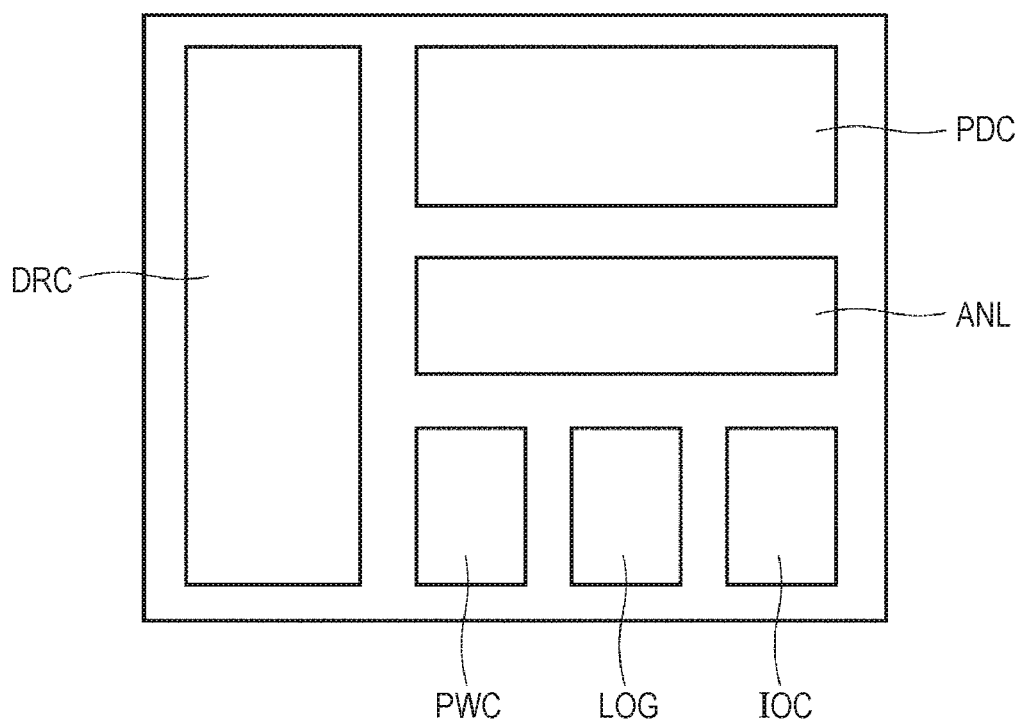
FIG. 1 is a schematic top view of a semiconductor device of a first embodiment.

Some embodiments will be described in detail with reference to drawings. In the following drawings, identical or similar portions are designated by the same reference numeral, and the same description is not repeated. The following embodiments may be appropriately combined at least partially.

First Embodiment

A configuration of a semiconductor device of a first embodiment is now described.

As shown in FIG. 1, the semiconductor device of the first embodiment includes an input/output circuit IOC, a logic circuit LOG, a power circuit PWC, an analog circuit ANL, a driver circuit DRC, and a predriver circuit PRC. However, the circuit configuration of the semiconductor device of the first embodiment is not limited to such a configuration.

Figure 2:
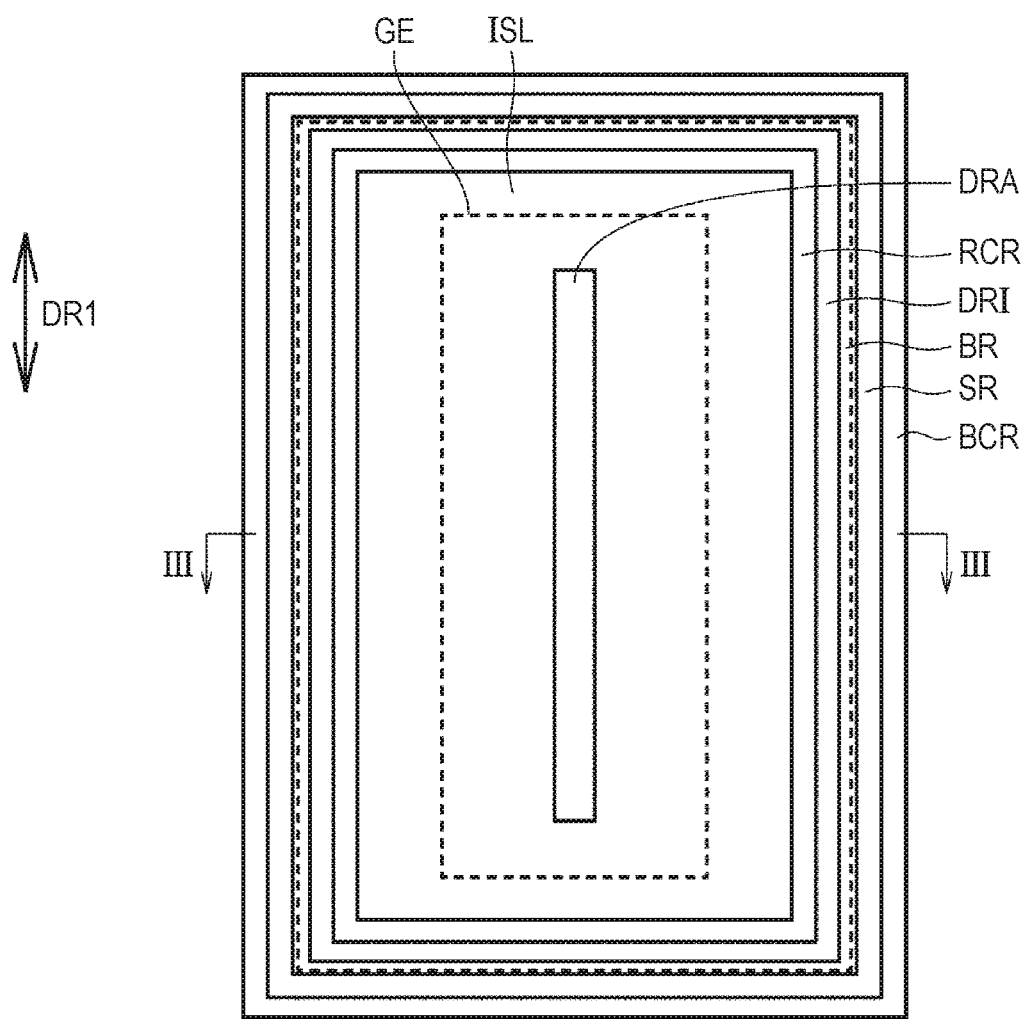
FIG. 2 is a top view of an input/output circuit IOC of the semiconductor device of the first embodiment.
Figure 3:
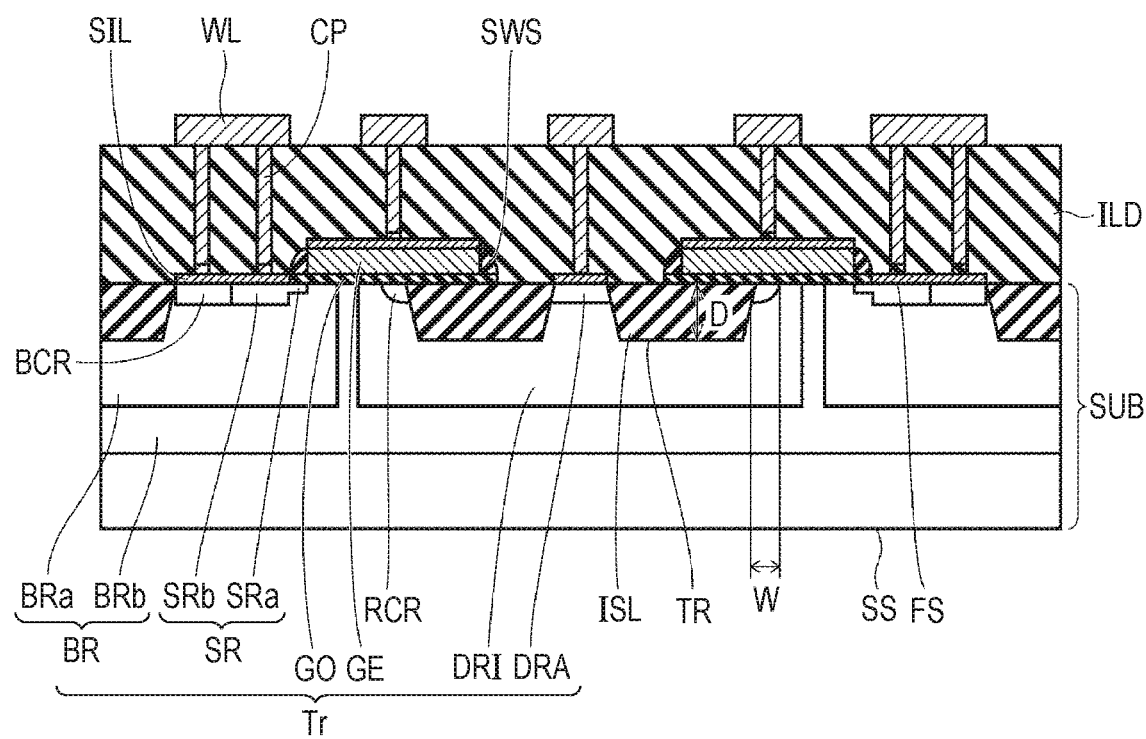
FIG. 3 is a sectional view along a line III-III in FIG. 2.

As shown in FIG. 2, the input/output circuit IOC has a transistor Tr. The transistor Tr is a LDMOS transistor. As shown in FIG. 3, the semiconductor device of the first embodiment includes a semiconductor substrate SUB.

The semiconductor substrate SUB has a first surface FS and a second surface SS. The first surface FS and the second surface SS configure the main surface of the semiconductor substrate SUB. The second surface SS is an opposite surface from the first surface FS. The semiconductor substrate SUB is made of single-crystal silicon (Si), for example.

A source region SR, a drain region DRA, a reverse conductivity region RCR, a body region BR, a drift region DRI, and a body contact region BCR are formed in the semiconductor substrate SUB.

The reverse conductivity region RCR, the body region BR, and the body contact region BCR have a common conductivity type opposite to a conductivity type common to the source region SR, the drain region DRA, and the drift region DRI. For example, the reverse conductivity region RCR, the body region BR, and the body contact region BCR have n-type conductivity in common, while the source region SR, the drain region DRA, and the drift region DRI have p-type conductivity in common.

The source region SR is formed in the first surface FS. The source region SR has a first portion SRa and a second portion SRb. The first portion SRa is located closer to the drift region DRI than the second portion SRb. The first portion SRa has a lower impurity concentration than the second portion SRb. That is, the source region SR has a lightly doped diffusion (LDD) structure.

The drain region DRA is formed in the first surface FS. The reverse conductivity region RCR is formed in the first surface FS between the source region SR and the drain region DRA. The reverse conductivity region RCR has a width W. The width W corresponds to a width of the reverse conductivity region RCR in a channel length direction (direction from the source region SR toward the drain region DRA). The body contact region BCR is formed in the first surface FS.

The body region BR is formed in the first surface FS so as to surround the source region SR and the body contact region BCR. The body region BR has a first portion BRa and a second portion BRb. The first portion Bra is formed in the first surface FS so as to surround the source region SR and the body contact region BCR. The second portion Brb is formed in the first surface FS so as to surround the first portion Bra and the drift region DRI. The first portion BRa has a higher impurity concentration than the second portion BRb. The drift region DRI surrounds the drain region DRA and the reverse conductivity region RCR. The body region BR has a portion sandwiched by the source region SR and the drift region DRI.

The semiconductor device of the first embodiment further includes an isolation film ISL. The isolation film ISL is formed in the first surface FS. The isolation film ISL is formed in the first surface FS so as to be sandwiched by the drain region DRA and the reverse conductivity region RCR. The isolation film ISL is made of silicon oxide ($SiO_2$), for example.

More specifically, the isolation film ISL is embedded in a trench TR that is formed in the first surface FS so as to be sandwiched by the drain region DRA and the reverse conductivity region RCR. The trench TR extends from the first surface FS toward the second surface SS. The isolation film ISL has a depth D. The depth D corresponds to a distance between the bottom surface of the isolation film ISL and the first surface FS. The width W is preferably smaller than the depth D (preferably less than 1.0 times of the depth D). Moreover, the width W is preferably at least 0.5 times larger than the depth D.

The semiconductor device of the first embodiment further includes a gate insulating film GO. The gate insulating film GO is formed on the first surface FS. More specifically, the gate insulating film GO is formed on the body region BR sandwiched by the source region SR and the drift region DRI. The gate insulating film GO is made of silicon oxide, for example.

The semiconductor device of the first embodiment further includes a gate electrode GE. The gate electrode GE is formed on the gate insulating film GO. That is, the gate electrode GE is opposed to the body region BR sandwiched by the source region SR and the drift region DRI while being insulated by the gate insulating film GO. The gate electrode GE may extend so as to reach over the isolation film ISL. The gate electrode GE is made of polycrystalline silicon doped with an impurity, for example.

The transistor Tr is configured by the source region SR, the drain region DRA, the body region BR, the drift region DRI, the gate insulating film GO, and the gate electrode GE.

As shown in FIG. 2, the drain region DRA extends along a direction DR1 in plan view (as viewed from a direction orthogonal to the first surface FS). The isolation film ISL surrounds the drain region DRA in plan view. The reverse conductivity region RCR surrounds the drain region DRA and the isolation film ISL in plan view. The drift region DRI surrounds the drain region DRA, the isolation film ISL, and the reverse conductivity region RCR in plan view. The source region SR surrounds the drain region DRA, the isolation film ISL, the reverse conductivity region RCR, and the drift region DRI in plan view.

As shown in FIG. 3, the semiconductor device of the first embodiment further includes a sidewall spacer SWS. The sidewall spacer SWS is formed on a side surface of the gate electrode GE. The sidewall spacer SWS is located on the first portion SRa. The sidewall spacer SWS is made of silicon nitride, for example.

The semiconductor device of the first embodiment further includes a silicide film SIL. The silicide film SIL is formed over the source region SR, the drain region DRA, the body contact region BCR, and the gate electrode GE. The silicide film SIL is made of a compound of cobalt (Co) or titanium (Ti) and silicon, for example.

The semiconductor device of the first embodiment further includes an interlayer insulating film ILD, a plurality of contact plugs CP, and a plurality of interconnections WL. The interlayer insulating film ILD is formed over the first surface FS so as to cover the transistor Tr. The interlayer insulating film ILD is made of silicon oxide, for example.

The contact plugs CP are formed in the interlayer insulating film ILD. The respective contact plugs CP are electrically coupled to the source region SR, the drain region DRA, the body contact region BCR, and the gate electrode GE via the silicide film SIL. The contact plugs CP are each made of tungsten (W), for example. While not shown, a barrier metal of titanium or titanium nitride (TiN) may be formed between the contact plug CP and the interlayer insulating film ILD.

The interconnections WL are formed on the interlayer insulating film ILD. The respective interconnections WL are electrically coupled to the contact plugs CP. Each interconnection WL is made of aluminum (Al) or aluminum alloy, for example.

There has been described a case where the number of interconnection layers is one. However, the semiconductor device of the first embodiment may have a larger number of interconnection layers.

A method of manufacturing the semiconductor device of the first embodiment is now described.

Figure 4:
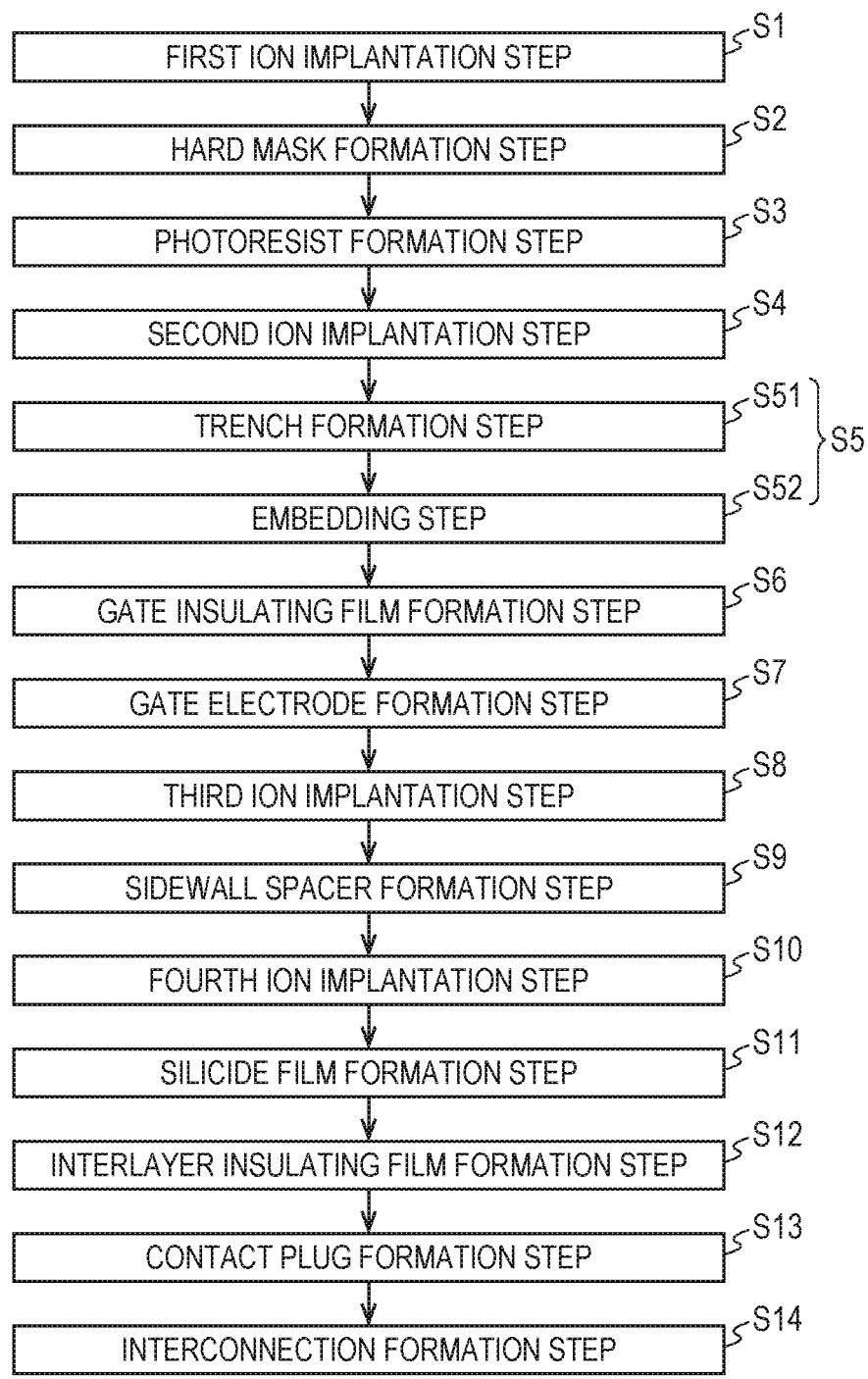
FIG. 4 is a process chart showing a method of manufacturing the semiconductor device of the first embodiment.

As shown in FIG. 4, a method of manufacturing the semiconductor device of the first embodiment includes a first ion implantation step S1, a hard mask formation step S2, a photoresist formation step S3, a second ion implantation step S4, and an isolation film formation step S5. The method further includes a gate insulating film formation step S6, a gate electrode formation step S7, a third ion implantation step S8, a sidewall spacer formation step S9, a fourth ion implantation step S10, and a silicide film formation step S11.

The method further includes an interlayer insulating film formation step S12, a contact plug formation step S13, and an interconnection formation step S14.

Figure 5:
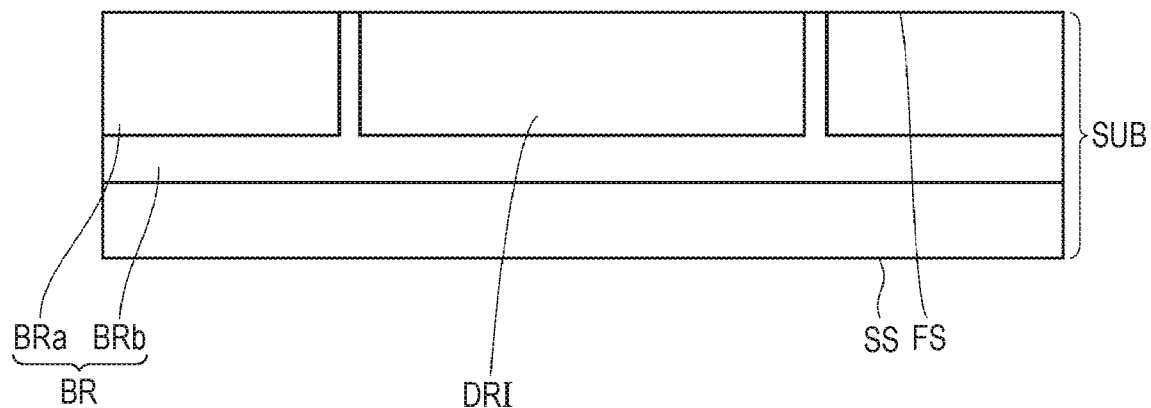
FIG. 5 is a sectional view of the semiconductor device of the first embodiment in a first ion implantation step S1.

As shown in FIG. 5, the body region BR and the drift region DRI are formed in the first ion implantation step S1.

The body region BR and the drift region DRI are formed by ion implantation, for example.

Figure 6:
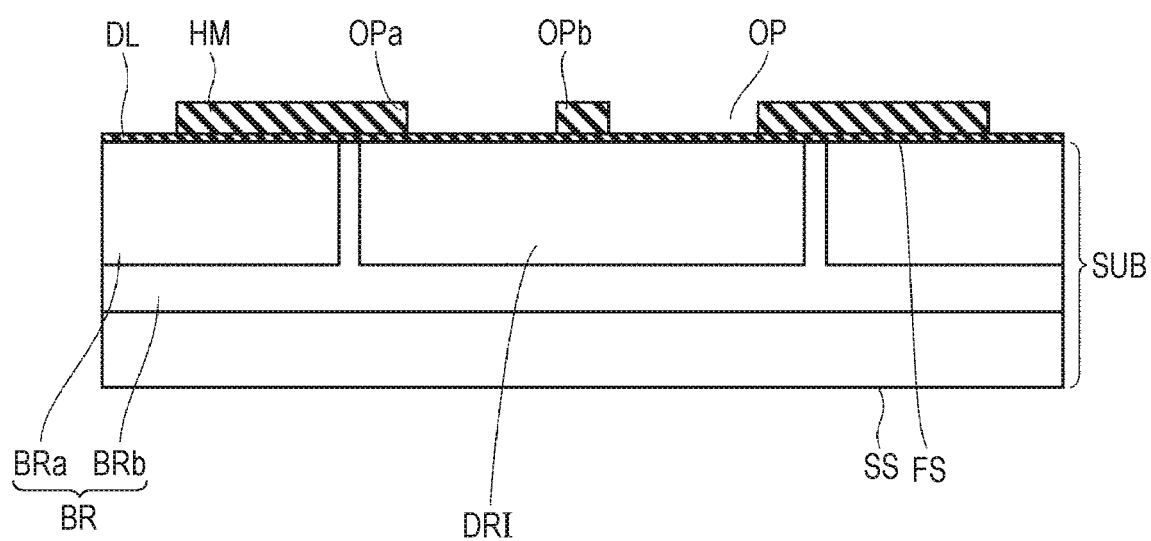
FIG. 6 is a sectional view of the semiconductor device of the first embodiment in a hard mask formation step S2.

As shown in FIG. 6, a hard mask HM is formed in the hard mask formation step S2. The hard mask HM is formed over the first surface FS. An insulating film DL is formed between the hard mask HM and the first surface FS.

The hard mask HM has an opening OP. The opening OP is formed over the drift region DRI. The hard mask HM has an edge part OPa and an edge part OPb. The edge part OPa is located on a side, close to the first portion Bra, of the opening OP. The edge part OPb is located opposite to the edge part OPa with respect to the opening OP.

The insulating film DL is formed by thermal oxidation, for example. In formation of the hard mask HM, first, a material to form the hard mask HM is deposited by chemical vapor deposition (CVD). The deposited material is then patterned by photolithography and etching.

Figure 7:
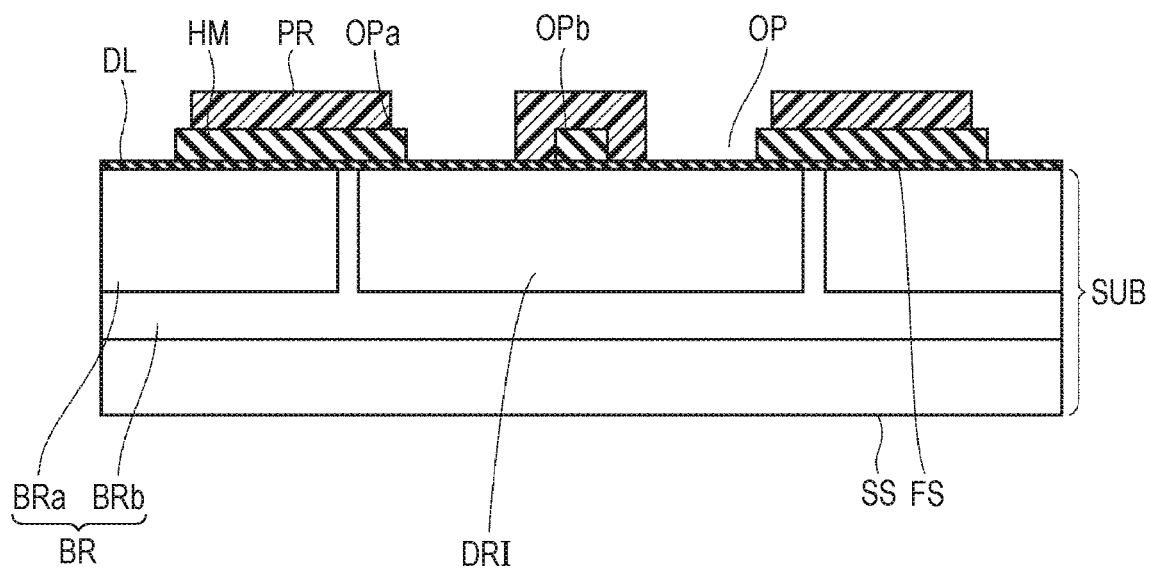
FIG. 7 is a sectional view of the semiconductor device of the first embodiment in a photoresist formation step S3.

As shown in FIG. 7, a photoresist PR is formed in the photoresist formation step S3. The photoresist PR is formed so as to cover the edge part OPb. The photoresist PR is formed by applying a photosensitive organic material to form the photoresist PR, and exposing and developing the applied photosensitive organic material.

Figure 8:
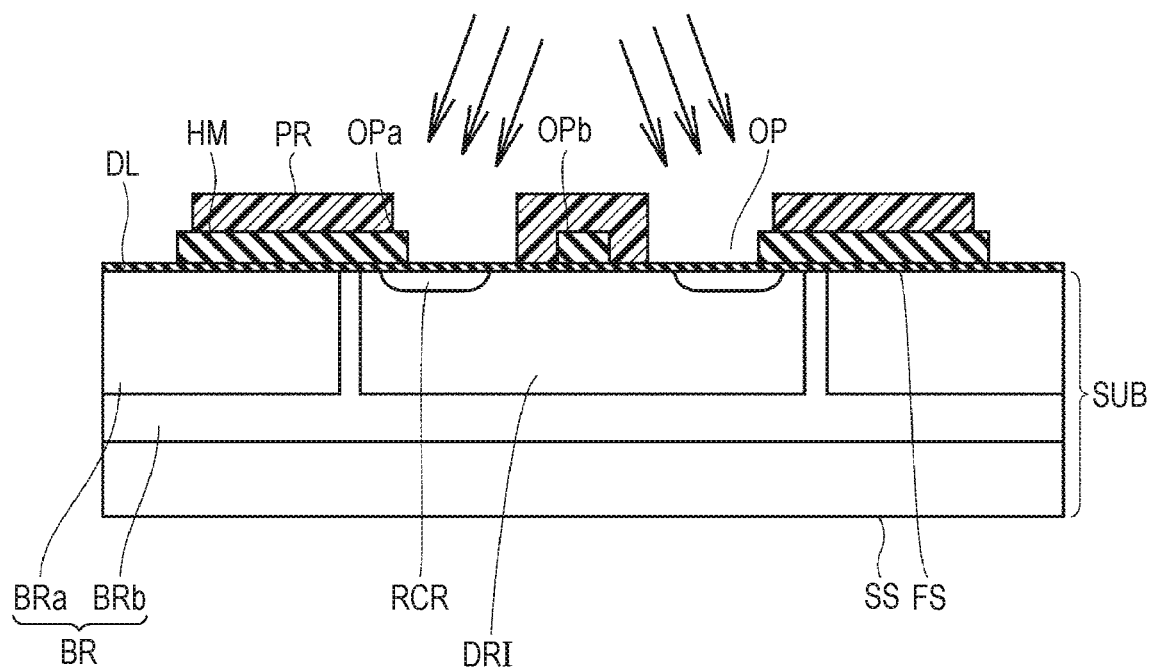
FIG. 8 is a sectional view of the semiconductor device of the first embodiment in a second ion implantation step S4.

As shown in FIG. 8, the reverse conductivity region RCR is formed in the second ion implantation step S4. The reverse conductivity region RCR is formed by ion implantation with the hard mask HM as a mask. Ion implantation in the second ion implantation step S4 is performed obliquely to the first surface FS such that ions enter below the edge part OPa. Since the edge part OPb is covered with the photoresist PR, no ion enters below the edge part OPb. After the second ion implantation step S4, the photoresist PR is removed.

Figure 9:
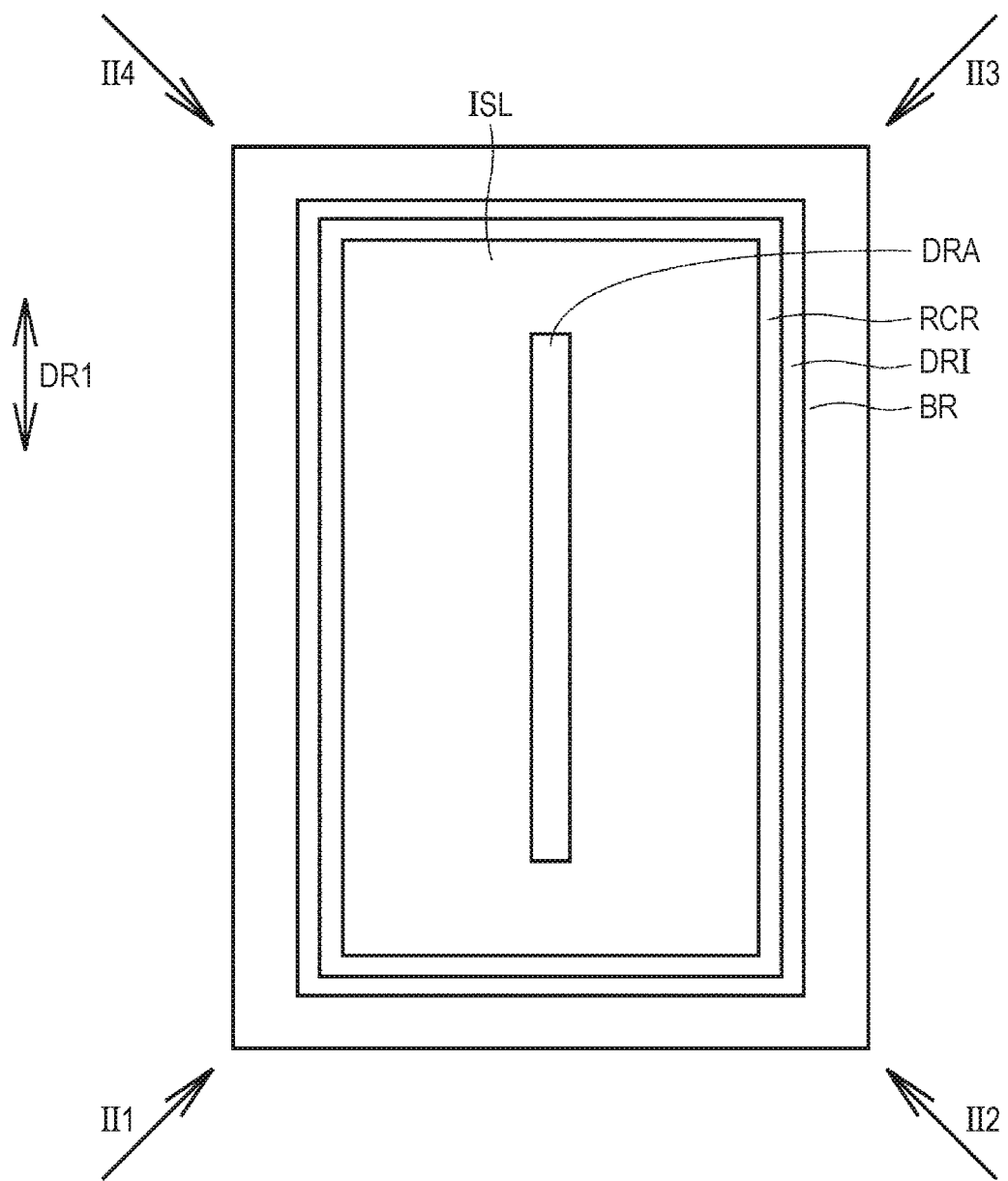
FIG. 9 is a top view of the semiconductor device of the first embodiment in the second ion implantation step S4.

As shown in FIG. 9, the ion implantation in the second ion implantation step S4 may be performed through first ion implantation II1, second ion implantation II2, third ion implantation II3, and fourth ion implantation II4. The first ion implantation II1 is performed along a first direction in plan view. The second ion implantation II2 is performed along a second direction in plan view. The third ion implantation II3 is performed along a third direction in plan view. The fourth ion implantation II4 is performed along a fourth direction in plan view.

The first direction is orthogonal to the second direction. The third direction is an opposite direction from the first direction. The fourth direction is an opposite direction from the second direction. Each of the first, second, third, and fourth directions is preferably different from the direction DR1 (extending direction of the drain region DRA in plan view).

Figure 10:
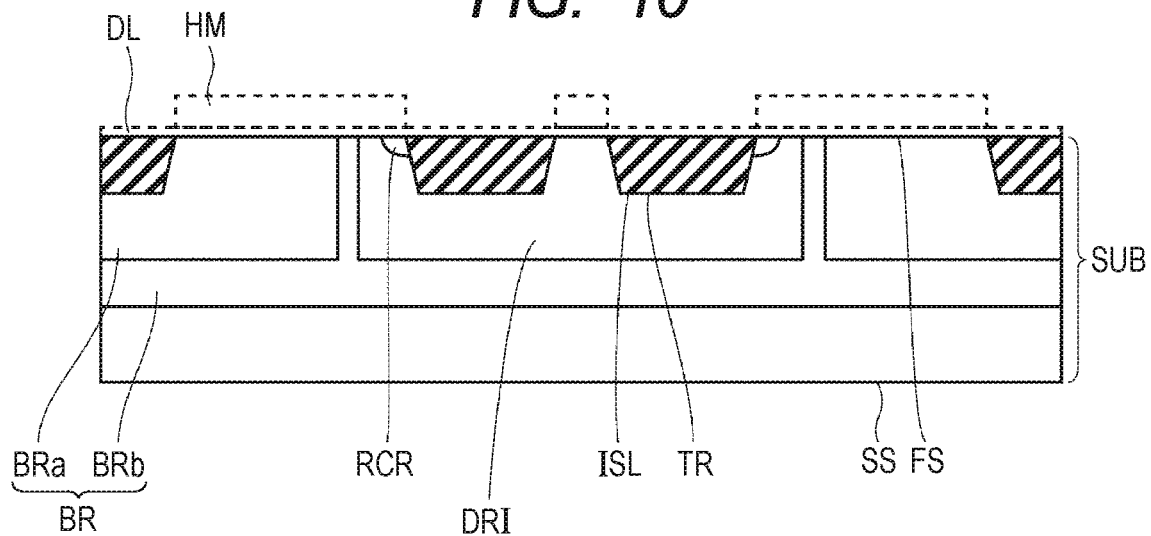
FIG. 10 is a sectional view of the semiconductor device of the first embodiment in an isolation film formation step S5.

As shown in FIG. 10, the isolation film ISL is formed in the isolation film formation step S5. The isolation film formation step S5 has a trench formation step S51 and an embedding step S52. The trench TR is formed in the trench formation step S51. The trench TR is formed by anisotropic etching such as reactive ion etching (RIE) with the hard mask HM as a mask. This removes an unnecessary portion of the reverse conductivity region RCR.

A material to form the isolation film ISL is embedded in the trench TR in the embedding step S52. Specifically, first, the trench TR is filled with the material to form the isolation film ISL by CVD or the like. The material filling the trench TR is then planarized by chemical mechanical polishing (CMP) or the like. Subsequently, the material is subjected to wet etching to adjust a difference in level of the isolation film ISL. After formation of the isolation film ISL, the hard mask HM and the insulating film DL are removed by etching or the like.

Figure 11:
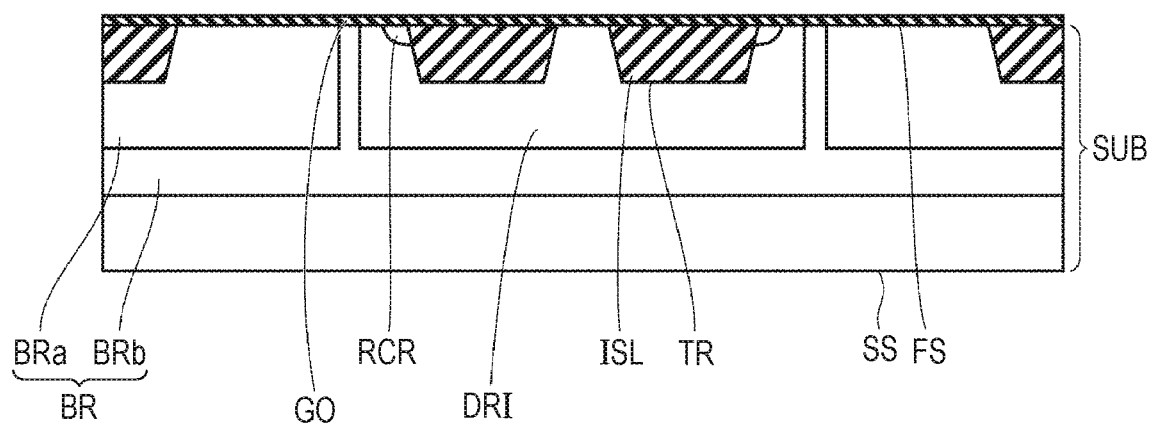
FIG. 11 is a sectional view of the semiconductor device of the first embodiment in a gate insulating film formation step S6.

As shown in FIG. 11, the gate insulating film GO is formed in the gate insulating film formation step S6. The gate insulating film GO is formed by thermal oxidation, for example.

Figure 12:
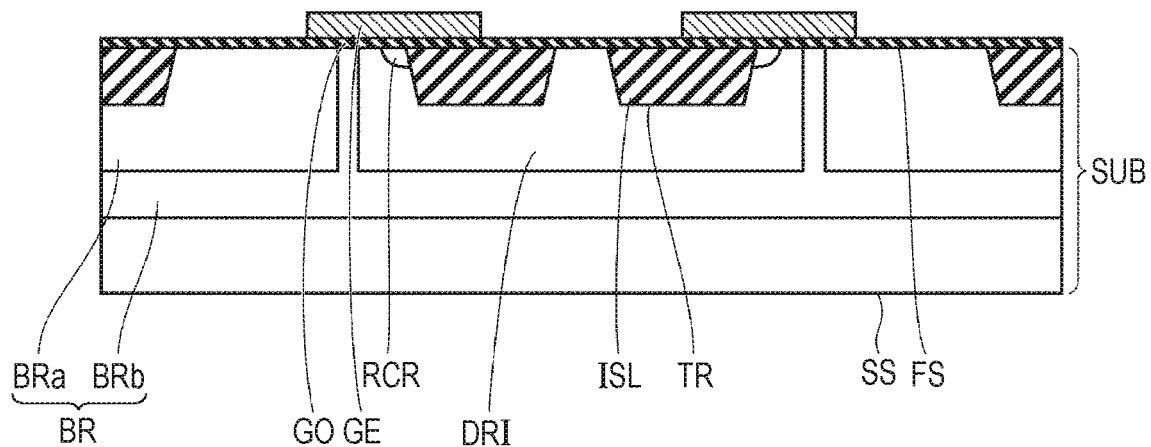
FIG. 12 is a sectional view of the semiconductor device of the first embodiment in a gate electrode formation step S7.

As shown in FIG. 12, the gate electrode GE is formed in the gate electrode formation step S7, in which, first, a material to form the gate electrode GE is deposited by CVD or the like. The deposited material is then patterned by photolithography and etching.

Figure 13:
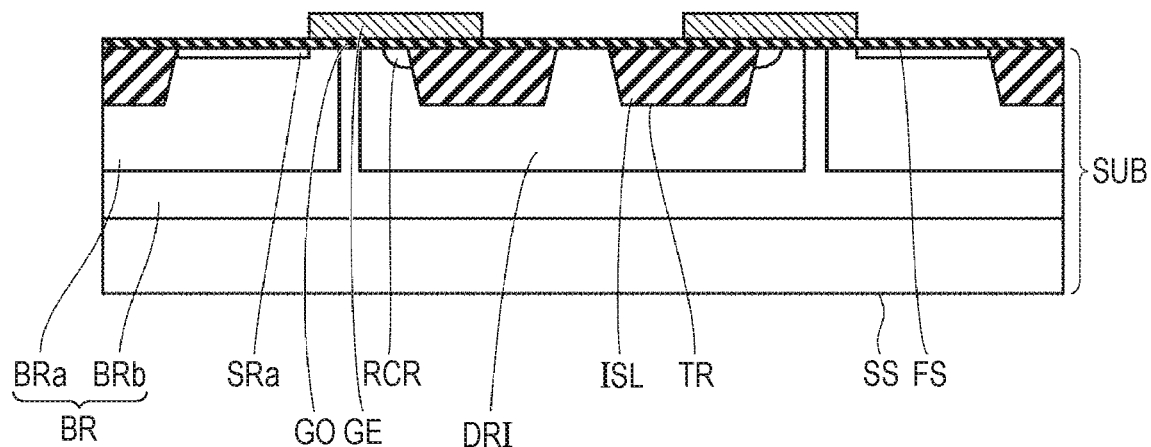
FIG. 13 is a sectional view of the semiconductor device of the first embodiment in a third ion implantation step S8.
Figure 14:
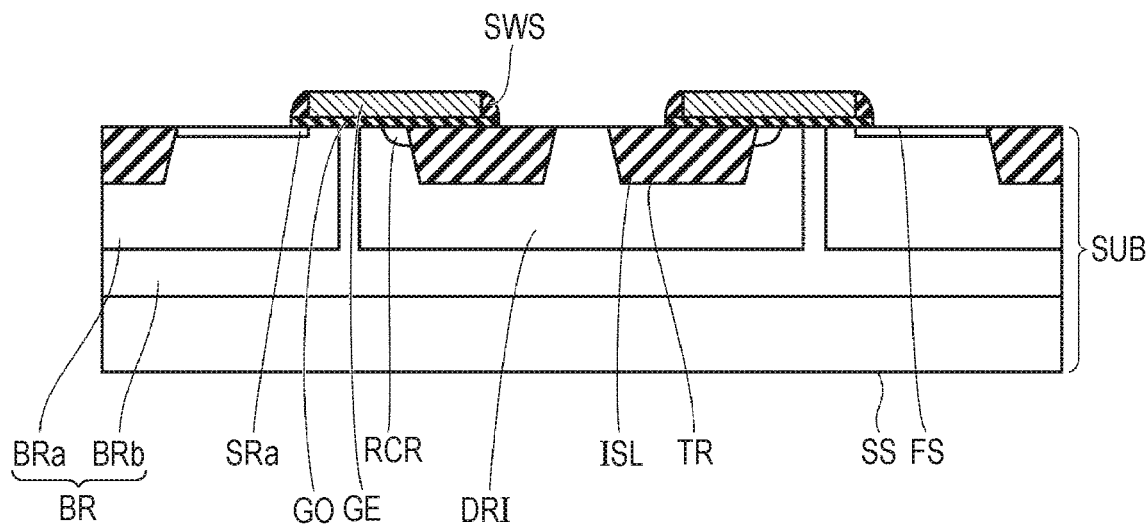
FIG. 14 is a sectional view of the semiconductor device of the first embodiment in a sidewall spacer formation step S9.

As shown in FIG. 13, the first portion SRa is formed in the third ion implantation step S8. The first portion SRa is formed by ion implantation. As shown in FIG. 14, the sidewall spacer SWS is formed in the sidewall spacer formation step S9. The sidewall spacer SWS is formed by depositing a material to form the sidewall spacer SWS by CVD or the like, and etching back the deposited material.

Figure 15:
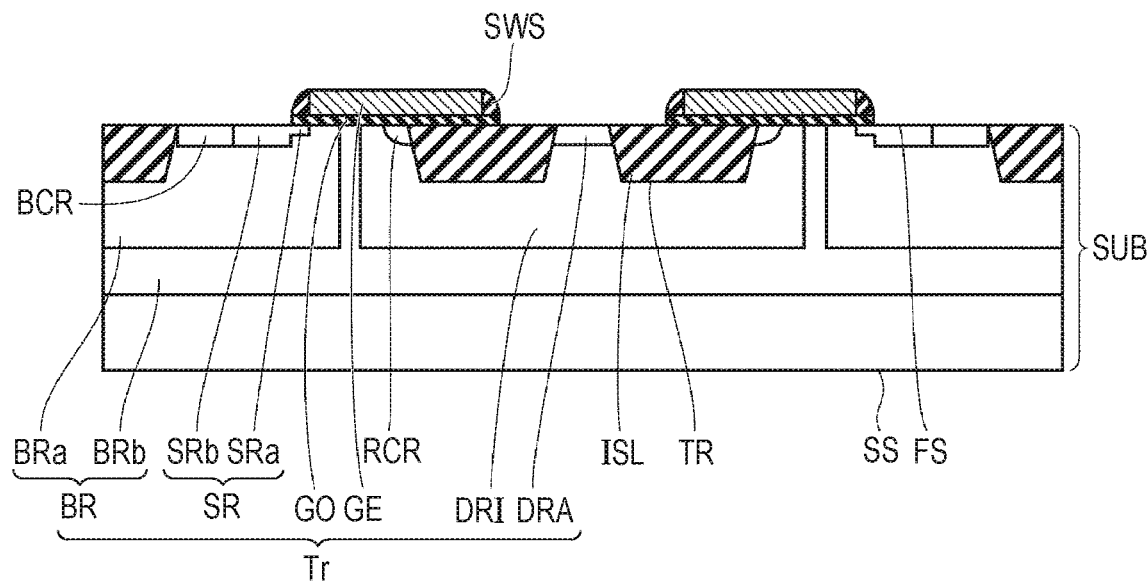
FIG. 15 is a sectional view of the semiconductor device of the first embodiment in a fourth ion implantation step S10.

As shown in FIG. 15, the second portion SRb, the drain region DRA, and the body contact region BCR are formed in the fourth ion implantation step S10. The second portion SRb, the drain region DRA, and the body contact region BCR are formed by ion implantation.

Figure 16:
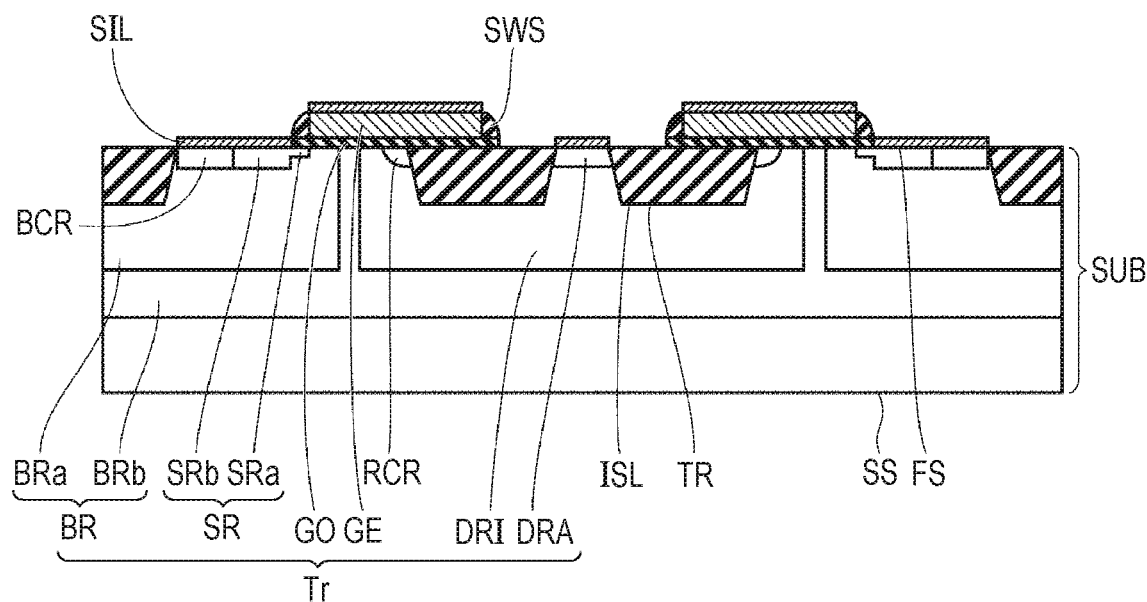
FIG. 16 is a sectional view of the semiconductor device of the first embodiment in a silicide film formation step S11.

As shown in FIG. 16, the silicide film SIL is formed in the silicide film formation step S11, in which, first, cobalt or titanium is deposited on the first surface FS. The deposited cobalt or titanium is then subjected to heat treatment. As a result, the deposited cobalt or titanium is reacted with silicon, leading to progress of silicide formation. Subsequently, the cobalt or titanium that is not reacted with silicon is removed by etching or the like.

Figure 17:
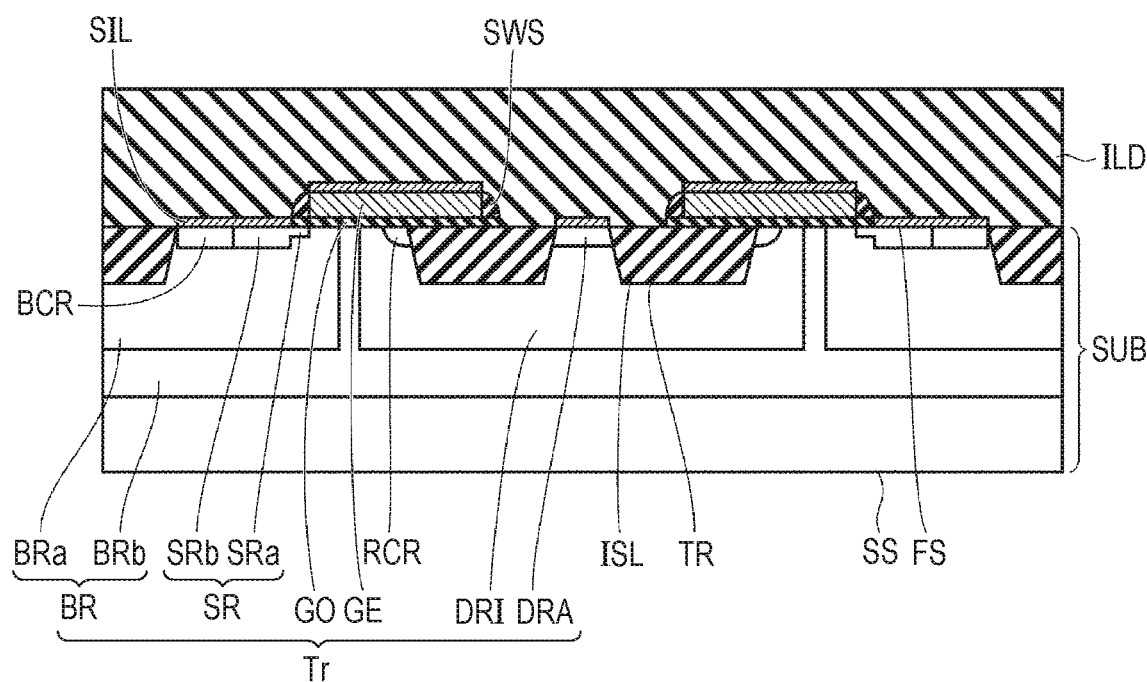
FIG. 17 is a sectional view of the semiconductor device of the first embodiment in an interlayer insulating film formation step S12.

As shown in FIG. 17, the interlayer insulating film ILD is formed in the interlayer insulating film formation step S12. The interlayer insulating film ILD is formed by depositing a material to form the interlayer insulating film ILD by CVD or the like, and planarizing the deposited material by CMP or the like.

Figure 18:
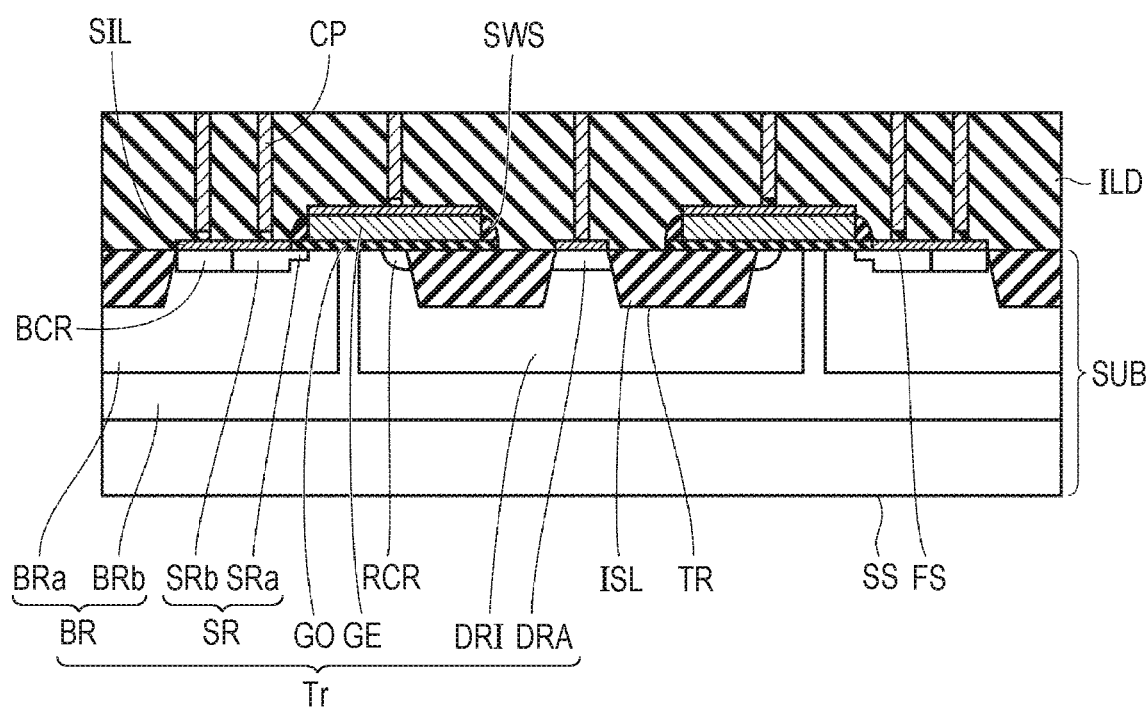
FIG. 18 is a sectional view of the semiconductor device of the first embodiment in a contact plug formation step S13.

As shown in FIG. 18, the contact plugs CP are formed in the contact plug formation step S13, in which, first, contact holes are formed in the interlayer insulating film ILD. A material to form the contact plugs CP is then embedded in the respective contact holes by CVD or the like. Subsequently, the material protruding from each contact hole is removed by CMP or the like.

The interconnections WL are formed in the interconnection formation step S14. The interconnections WL are formed by depositing a material to form the interconnections WL by sputtering or the like, and patterning the deposited material by photolithography and etching. In this way, the structure of the semiconductor device of the first embodiment as shown in FIGS. 2 and 3 is formed. Although there has been described a case where the number of interconnection layers is one, if the number of interconnection layers is two or more, the step of forming the interlayer insulating film ILD, the step of forming the via plugs, and the step of forming the interconnections are sequentially repeated.

Effects of the semiconductor device and the method of manufacturing the semiconductor device of the first embodiment are now described.

As described above, the semiconductor device of the first embodiment includes the reverse conductivity region RCR. The reverse conductivity region RCR forms a pn junction with the drift region DRI, leading to formation of a depleted layer. The depleted layer reduces an electric field in the semiconductor substrate SUB located directly below the gate insulating film GO, and thus hot carriers become less likely to be accelerated toward the gate insulating film GO. The semiconductor device of the first embodiment therefore suppresses deterioration of the gate insulating film GO due to hot carrier injection, leading to improvement in reliability of the semiconductor device.

Figure 19:
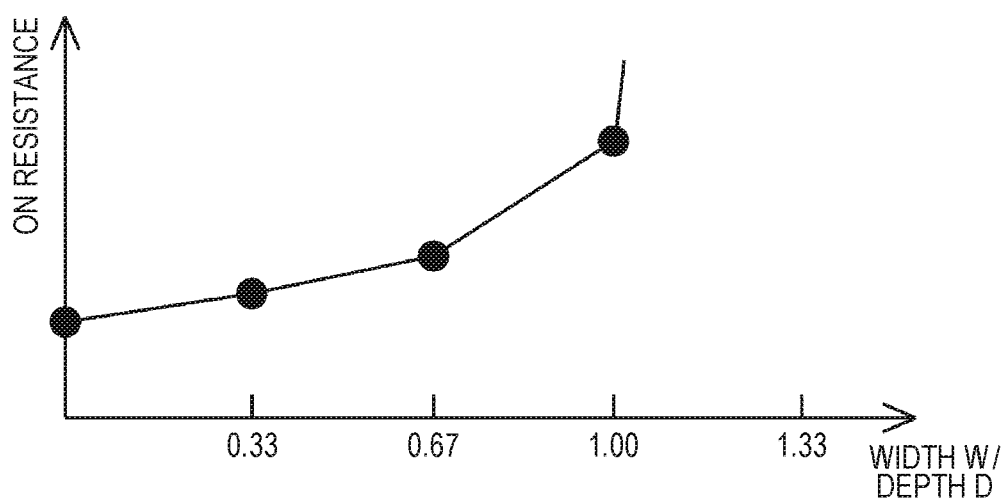
FIG. 19 is a graph showing a relationship between width W and on resistance.

When the reverse conductivity region RCR is formed by ion implantation with a photoresist as a mask, the width W may be varied due to a variation in opening width of the photoresist. As shown in FIG. 19, on resistance of the semiconductor device of the first embodiment increases with the width W.

In the semiconductor device of the first embodiment, since the reverse conductivity region RCR can be formed in a self-aligning manner using the same mask (hard mask HM) as that for the isolation film ISL, the width W can be accurately controlled. According to the semiconductor device and the method of manufacturing the semiconductor device of the first embodiment, therefore, it is possible to suppress an increase in on resistance while reliability of the semiconductor device is improved.

In the method of manufacturing the semiconductor device of the first embodiment, when the second ion implantation step S4 is performed through the first ion implantation II1 to the fourth ion implantation II4, and when the first to fourth directions are each different from the direction DR1 (extending direction of the drain region DRA in plan view), overlapping ion implantation is less likely to be performed on the reverse conductivity region RCR, allowing uniform impurity concentration of the reverse conductivity region RCR.

As shown in FIG. 19, when the width W is larger than the depth D, on resistance increases conspicuously. In the semiconductor device and the method of manufacturing the semiconductor device of the first embodiment, when the width W is smaller than the depth D, an increase in on resistance can be thus suppressed. Excessively small width W however reduces the field reduction effect of the reverse conductivity region RCR. In the semiconductor device and the method of manufacturing the semiconductor device of the first embodiment, if the width W is at least 0.5 times larger than the depth D, it is possible to improve the reliability of the semiconductor device while suppressing an increase in on resistance.

Second Embodiment

Since a configuration of a semiconductor device of a second embodiment is the same as the configuration of the semiconductor device of the first embodiment, the description thereof is omitted.

A method of manufacturing the semiconductor device of the second embodiment is now described. In the following, differences from the method of manufacturing the semiconductor device of the first embodiment are mainly described, and the same description is not repeated.

Figure 20:
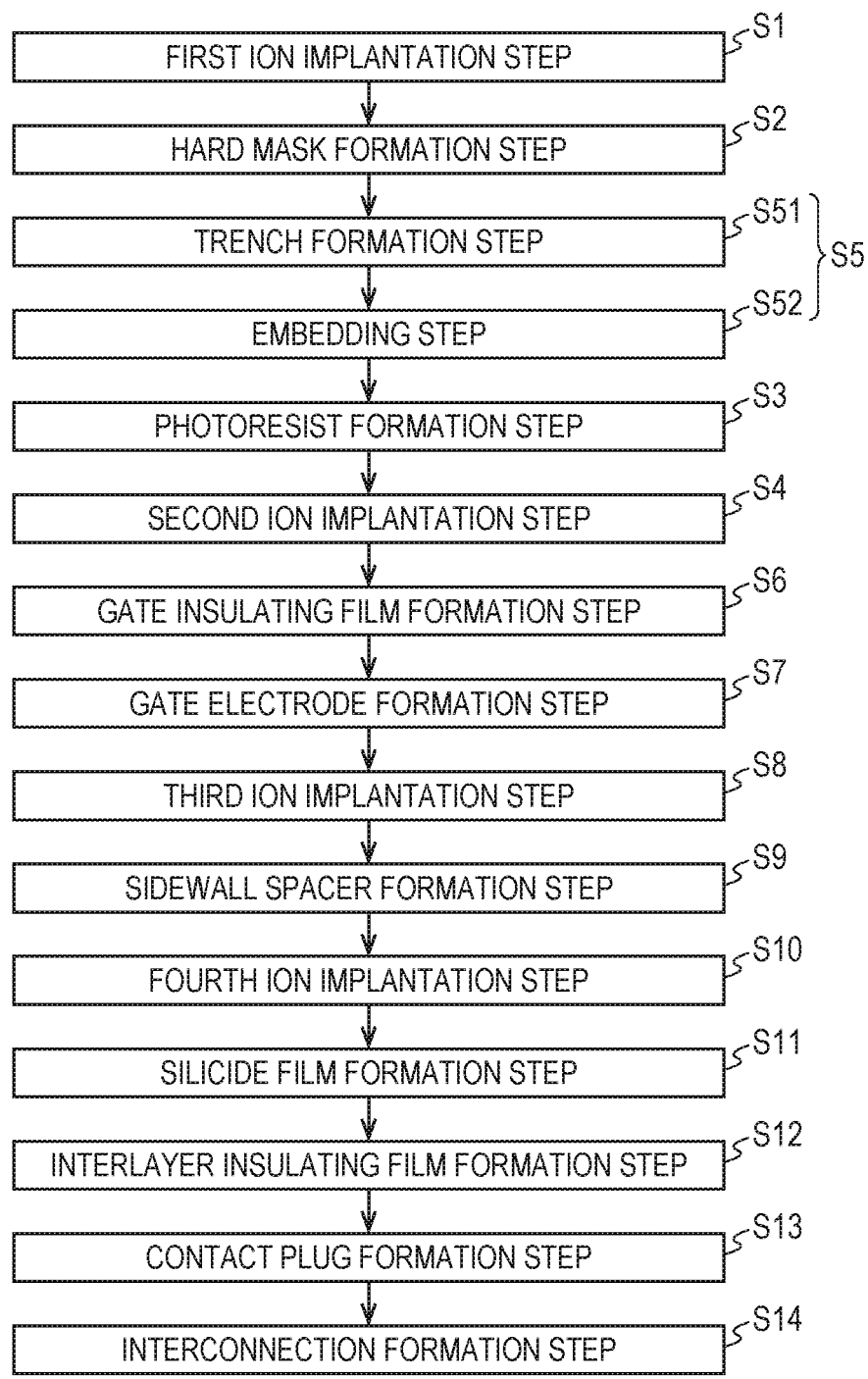
FIG. 20 is a process chart showing a method of manufacturing a semiconductor device of a second embodiment.

As shown in FIG. 20, the method of manufacturing the semiconductor device of the second embodiment includes a first ion implantation step S1, a hard mask formation step S2, a photoresist formation step S3, a second ion implantation step S4, and an isolation film formation step S5 as in the method of manufacturing the semiconductor device of the first embodiment. The method further includes a gate insulating film formation step S6, a gate electrode formation step S7, a third ion implantation step S8, a sidewall spacer formation step S9, a fourth ion implantation step S10, and a silicide film formation step S11.

The method further includes an interlayer insulating film formation step S12, a contact plug formation step S13, and an interconnection formation step S14 as with the method of manufacturing the semiconductor device of the first embodiment.

The method of the second embodiment is however different from the method of the first embodiment in terms of the order of the photoresist formation step S3, the second ion implantation step S4, and the isolation film formation step S5.

Figure 21:
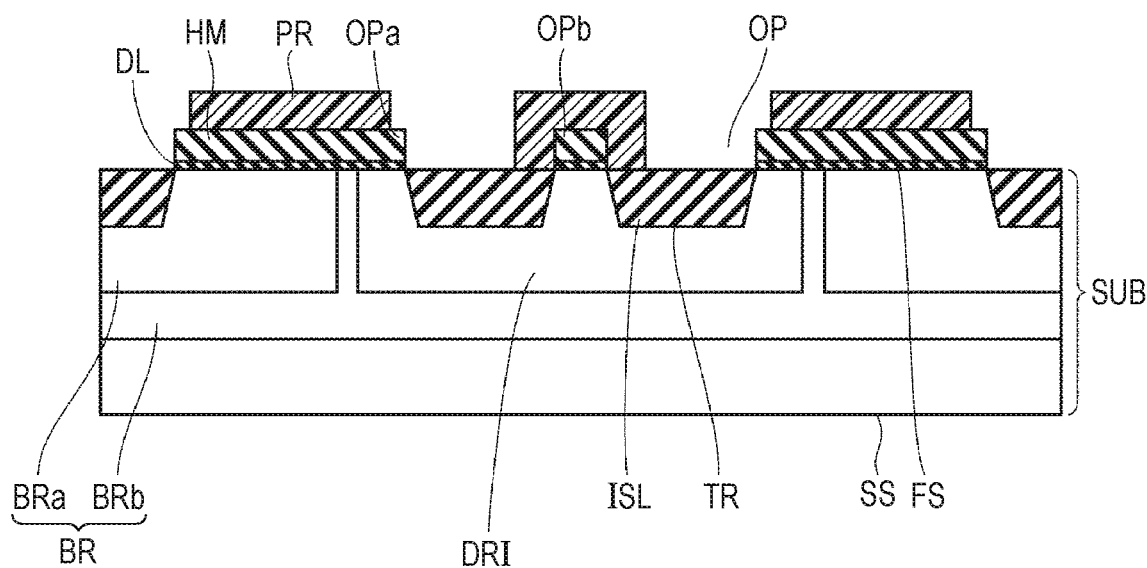
FIG. 21 is a sectional view of the semiconductor device of the second embodiment in the photoresist formation step S3.
Figure 22:
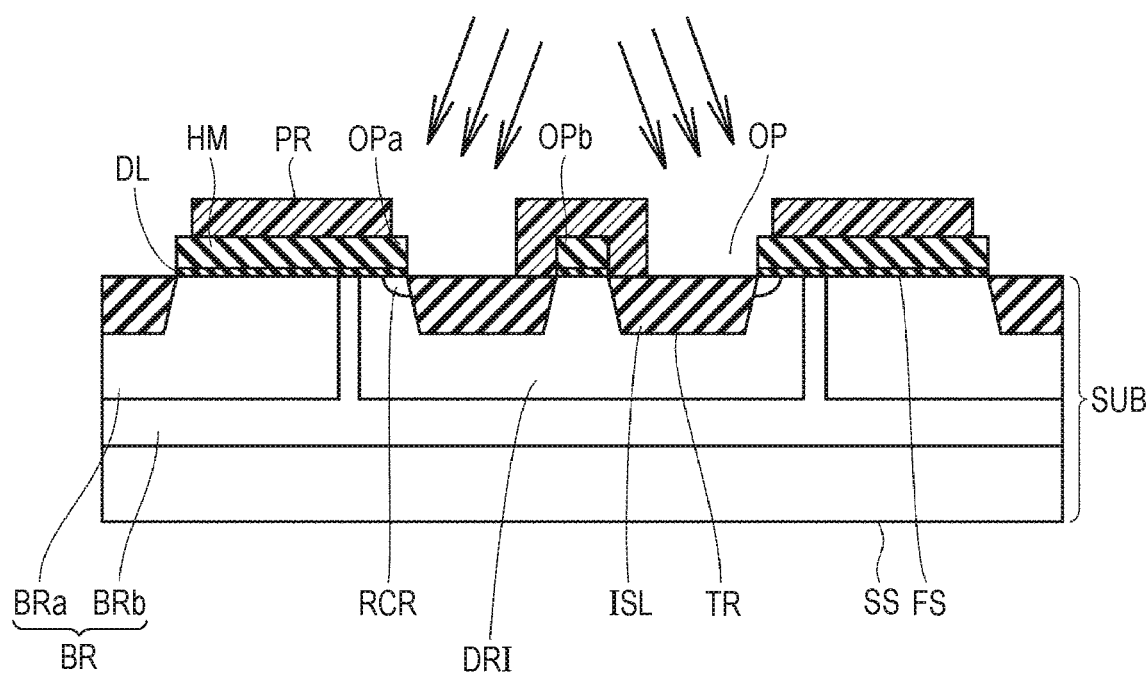
FIG. 22 is a sectional view of the semiconductor device of the second embodiment in a second ion implantation step S4.

As shown in FIGS. 21 and 22, in the method of the second embodiment, the isolation film formation step S5 is performed after the hard mask formation step S2 and before the photoresist formation step S3 and the second ion implantation step S4.

Effects of the semiconductor device and the method of manufacturing the semiconductor device of the second embodiment are now described. In the following, differences from the effects of the semiconductor device and the method of manufacturing the semiconductor device of the first embodiment are mainly described, and the same description is not repeated.

In the method of manufacturing the semiconductor device of the first embodiment, the second ion implantation step S4 is performed after the isolation film formation step S5. In the method of the first embodiment, therefore, when etching of the hard mask HM is completed, the semiconductor device must be temporarily taken out from an etching apparatus for cleaning or the like.

On the other hand, in the semiconductor device of the second embodiment, the isolation film formation step S5 is performed immediately after the hard mask formation step S2. In the method of manufacturing the semiconductor device of the second embodiment, therefore, when etching of the hard mask HM is completed, the semiconductor device need not be temporarily taken out from the etching apparatus for cleaning or the like, and etching can be directly continued to form the trench TR while an etching gas is changed. In this way, the method of manufacturing the semiconductor device of the second embodiment makes it possible to simplify a manufacturing process.

Third Embodiment

Since a configuration of a semiconductor device of a third embodiment is the same as the configuration of the semiconductor device of the first embodiment, the description thereof is omitted.

Figure 23:
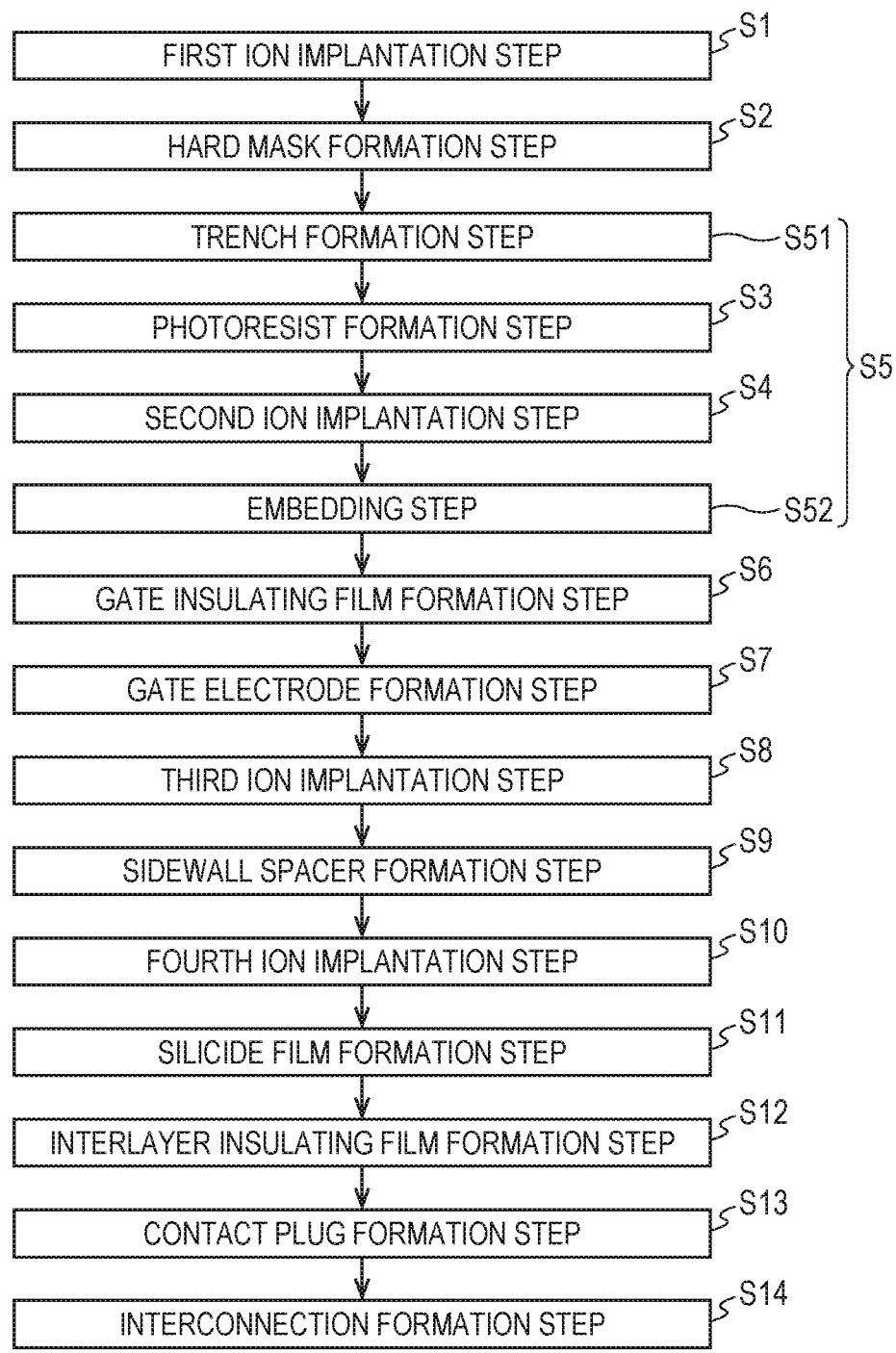
FIG. 23 is a process chart showing a method of manufacturing a semiconductor device of a third embodiment.

As shown in FIG. 23, the method of manufacturing the semiconductor device of the third embodiment includes a first ion implantation step S1, a hard mask formation step S2, a photoresist formation step S3, a second ion implantation step S4, and an isolation film formation step S5 as in the method of manufacturing the semiconductor device of the first embodiment. The method further includes a gate insulating film formation step S6, a gate electrode formation step S7, a third ion implantation step S8, a sidewall spacer formation step S9, a fourth ion implantation step S10, and a silicide film formation step S11.

The method further includes an interlayer insulating film formation step S12, a contact plug formation step S13, and an interconnection formation step S14 as with the method of manufacturing the semiconductor device of the first embodiment.

The method of the third embodiment is however different from the method of the first embodiment in terms of the order of the photoresist formation step S3, the second ion implantation step S4, and the isolation film formation step S5.

Figure 24:
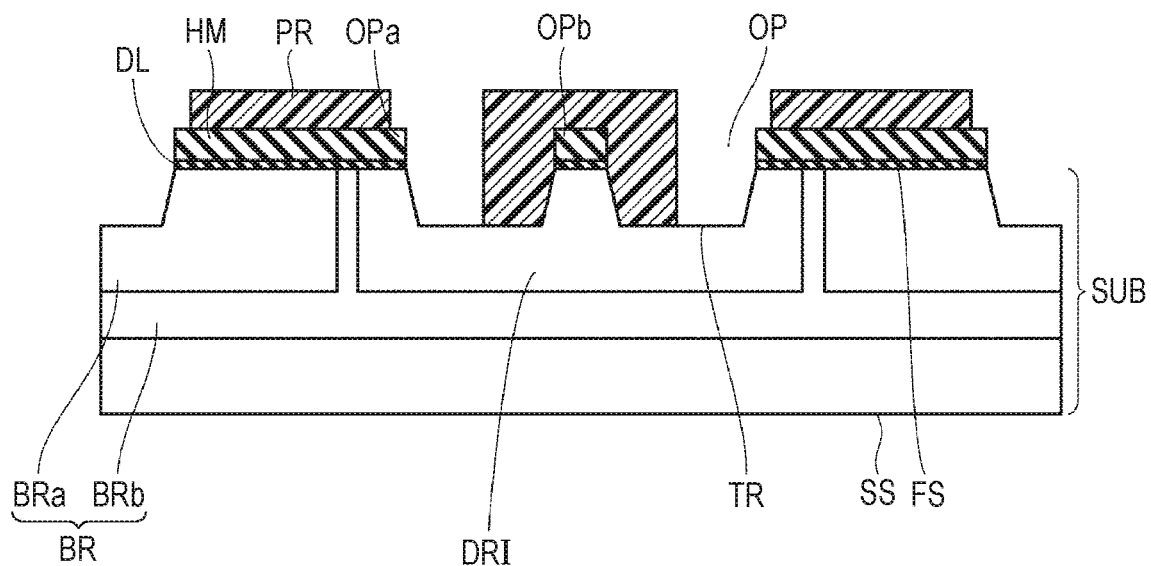
FIG. 24 is a sectional view of the semiconductor device of the third embodiment in a photoresist formation step S3.
Figure 25:
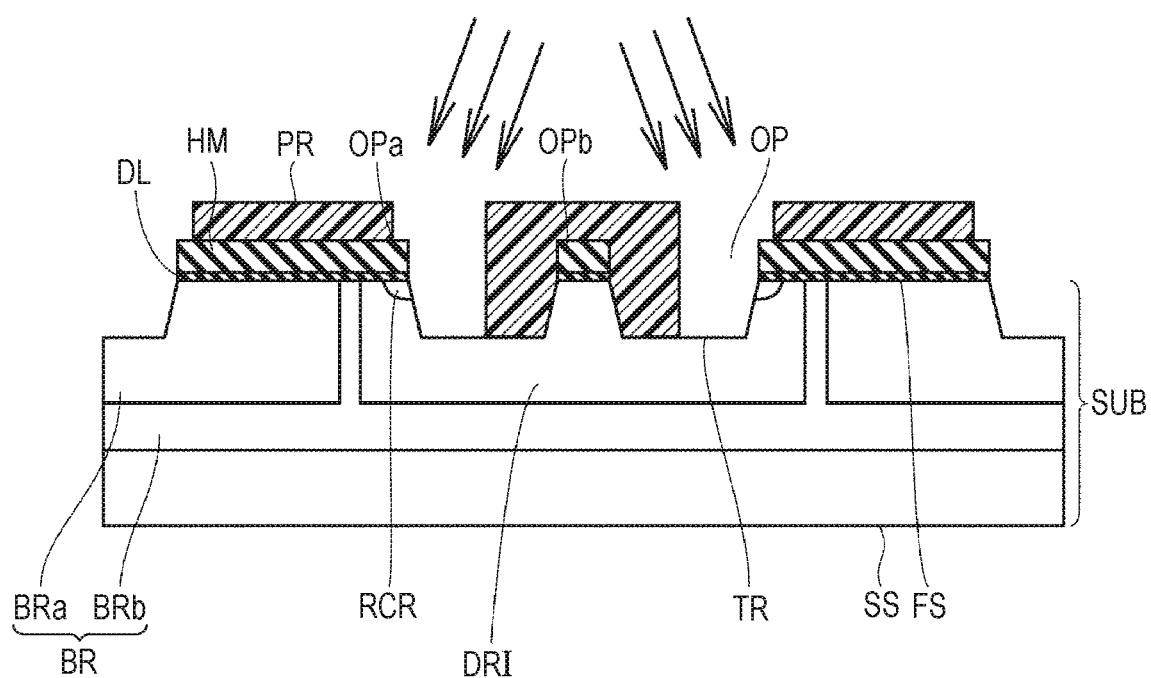
FIG. 25 is a sectional view of the semiconductor device of the third embodiment in a second ion implantation step S4.

As shown in FIG. 24, in the method of the third embodiment, the trench formation step S51 is performed after the hard mask formation step S2 and before the photoresist formation step S3 and the second ion implantation step S4. As shown in FIG. 25, the embedding step S52 is performed after the photoresist formation step S3 and the second ion implantation step S4.

As shown in FIG. 25, in the photoresist formation step S3, the photoresist PR extends from an edge part OPb side to an edge part OPa side such that the reverse conductivity region RCR is not formed in any region other than a region below the edge part OPa. The extending amount of the photoresist PR to the edge part OPa side is appropriately determined according to an ion implantation angle in the second ion implantation step S4.

Effects of the semiconductor device and the method of manufacturing the semiconductor device of the third embodiment are now described. In the following, differences from the effects of the semiconductor device and the method of manufacturing the semiconductor device of the first embodiment are mainly described, and the same description is not repeated.

As described above, in the method of manufacturing the semiconductor device of the first embodiment, when etching of the hard mask HM is completed, the semiconductor device must be temporarily taken out from an etching apparatus for cleaning or the like.

On the other hand, in the method of manufacturing the semiconductor device of the third embodiment, the trench formation step S51 is performed immediately after the hard mask formation step S2. In the method of the third embodiment, therefore, when etching of the hard mask HM is completed, the semiconductor device need not be temporarily taken out from the etching apparatus for cleaning or the like, and etching can be directly continued to form the trench TR while an etching gas is changed. The method of the third embodiment thus makes it possible to simplify a manufacturing process.

First Modification of Third Embodiment

A configuration of a semiconductor device of a first modification of the third embodiment is now described. In the following, differences from the configuration of the semiconductor device of the third embodiment are mainly described, and the same description is not repeated.

Figure 26:
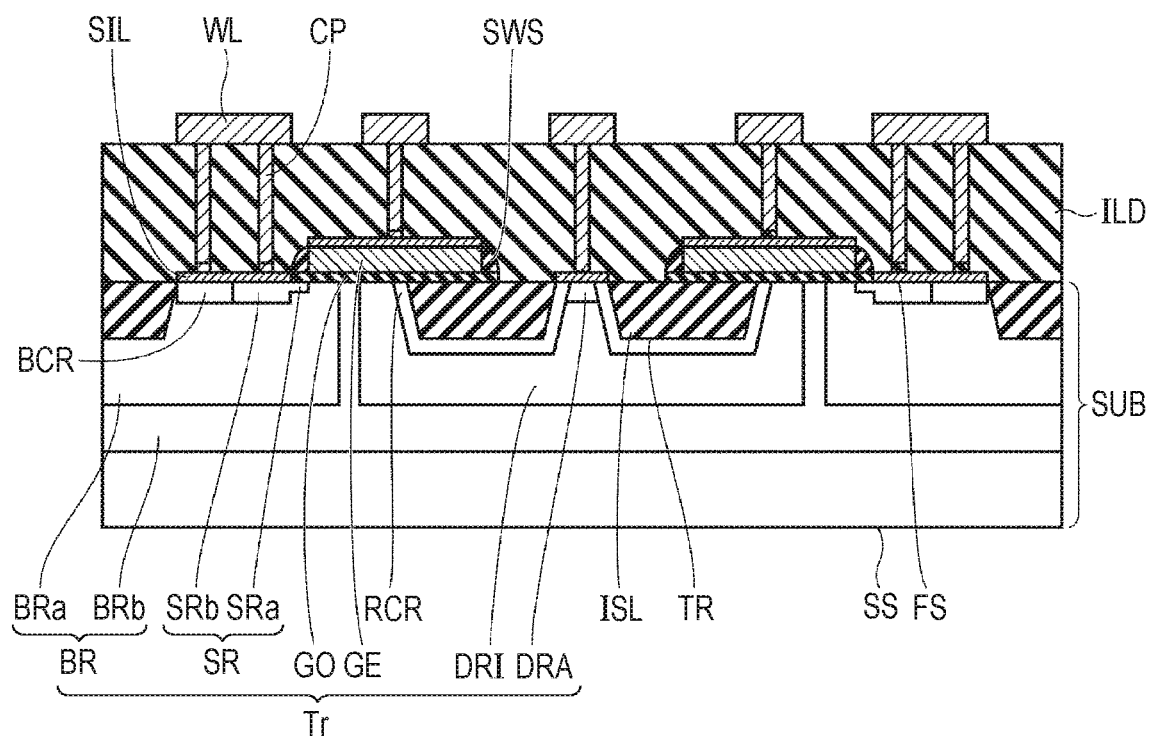
FIG. 26 is a sectional view of a semiconductor device of a first modification of the third embodiment.

As shown in FIG. 26, the semiconductor device of the first modification of the third embodiment includes a semiconductor substrate SUB, an isolation film ISL, a gate insulating film GO, a gate electrode GE, a sidewall spacer SWS, a silicide film SIL, an interlayer insulating film ILD, contact plugs CP, and interconnections WL.

The semiconductor substrate SUB has a first surface FS. A source region SR, a drain region DRA, a reverse conductivity region RCR, a body contact region BCR, a body region BR, and a drift region DRI are formed in the semiconductor substrate SUB. With regard to these, the configuration of the semiconductor device of the first modification of the third embodiment is in common with the configuration of the semiconductor device of the third embodiment.

However, the configuration of the semiconductor device of the first modification of the third embodiment is different from the configuration of the semiconductor device of the third embodiment in terms of a position of the reverse conductivity region RCR. In the semiconductor device of the first modification of the third embodiment, the reverse conductivity region RCR is formed in the first surface FS so as to surround the isolation film ISL.

A method of manufacturing the semiconductor device of the first modification of the third embodiment is now described. In the following, differences from the method of manufacturing the semiconductor device of the third embodiment are mainly described, and the same description is not repeated.

Figure 27:
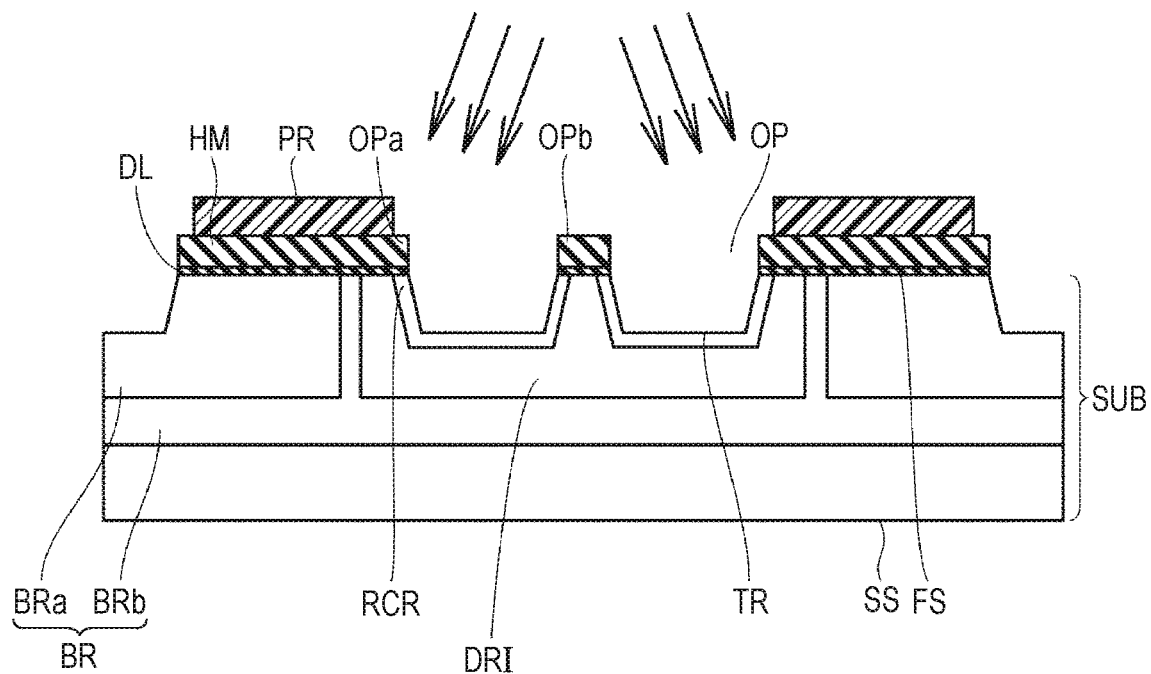
FIG. 27 is a sectional view of the semiconductor device of the first modification of the third embodiment in a second ion implantation step S4.

The method of manufacturing the semiconductor device of the first modification of the third embodiment is the same as the method of manufacturing the semiconductor device of the third embodiment. However, as shown in FIG. 27, the photoresist PR is formed so as not to cover the edge part OPa and the edge part OPb in the photoresist formation step S3. Consequently, ion implantation in the second ion implantation step S4 is performed on both side surfaces and the bottom surface of the trench TR.

Effects of the semiconductor device and the method of manufacturing the semiconductor device of the first modification of the third embodiment are now described. In the following, differences from the effects of the semiconductor device and the method of manufacturing the semiconductor device of the third embodiment are mainly described, and the same description is not repeated.

In the semiconductor device of the third embodiment, on resistance may increase due to trapping of conductive carriers by interface states at an interface between the isolation film ISL and the drift region DRI. In the semiconductor device of the first modification of the third embodiment, the reverse conductivity region RCR is formed so as to surround the isolation film ISL, making it possible to suppress such an increase in on resistance due to trapping of conductive carriers by interface states. According to the method of manufacturing the semiconductor device of the first modification of the third embodiment, the reverse conductivity region RCR serving as described above can be accurately formed in a self-aligning manner.

Second Modification of Third Embodiment

A configuration of a semiconductor device of a second modification of the third embodiment is now described. In the following, differences from the configuration of the semiconductor device of the third embodiment are mainly described, and the same description is not repeated.

Figure 28:
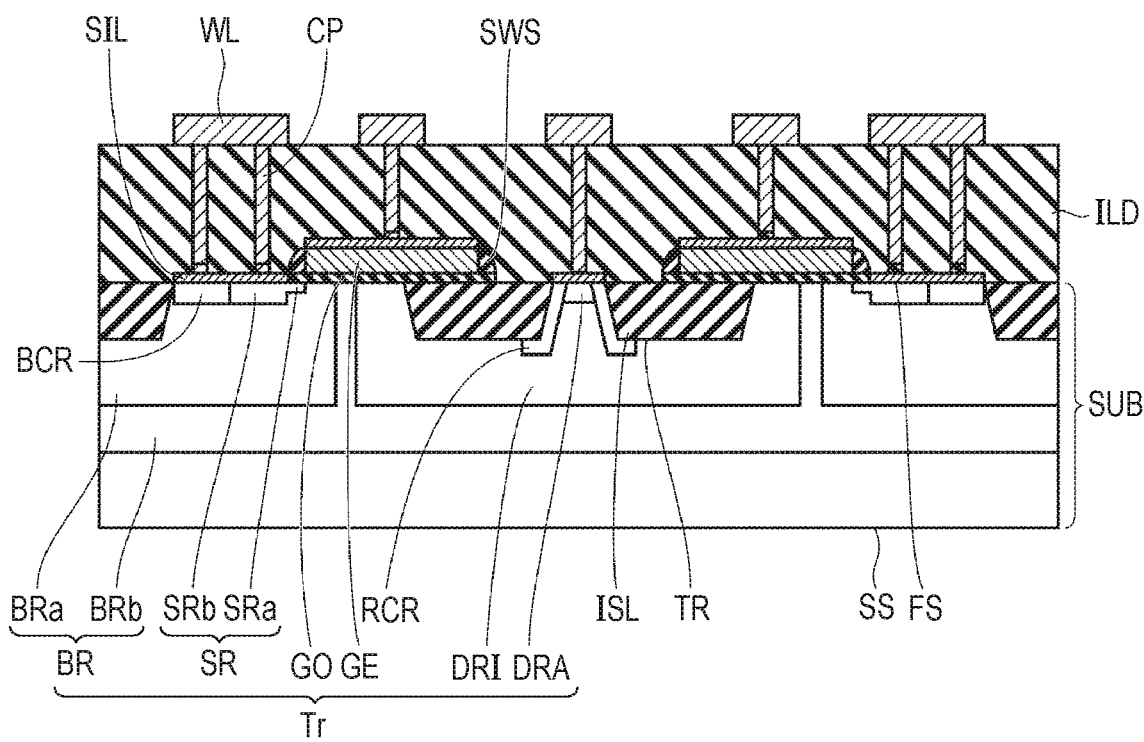
FIG. 28 is a sectional view of a semiconductor device of a second modification of the third embodiment.

As shown in FIG. 28, the semiconductor device of the second modification of the third embodiment includes a semiconductor substrate SUB, an isolation film ISL, a gate insulating film GO, a gate electrode GE, a sidewall spacer SWS, a silicide film SIL, an interlayer insulating film ILD, contact plugs CP, and interconnections WL.

The semiconductor substrate SUB has a first surface FS. A source region SR, a drain region DRA, a reverse conductivity region RCR, a body contact region BCR, a body region BR, and a drift region DRI are formed in the semiconductor substrate SUB. With regard to these, the configuration of the semiconductor device of the second modification of the third embodiment is in common with the configuration of the semiconductor device of the third embodiment.

However, the configuration of the semiconductor device of the second modification of the third embodiment is different from the configuration of the semiconductor device of the third embodiment in terms of a position of the reverse conductivity region RCR. In the semiconductor device of the second modification of the third embodiment, the reverse conductivity region RCR is formed so as to cover a side surface, which is located on a side close to the drain region DRA, of the isolation film ISL, and cover part of the bottom surface, which is continued from the side surface on the drain region DRA side, of the isolation film ISL.

A method of manufacturing the semiconductor device of the second modification of the third embodiment is now described. In the following, differences from the method of manufacturing the semiconductor device of the third embodiment are mainly described, and the same description is not repeated.

Figure 29:
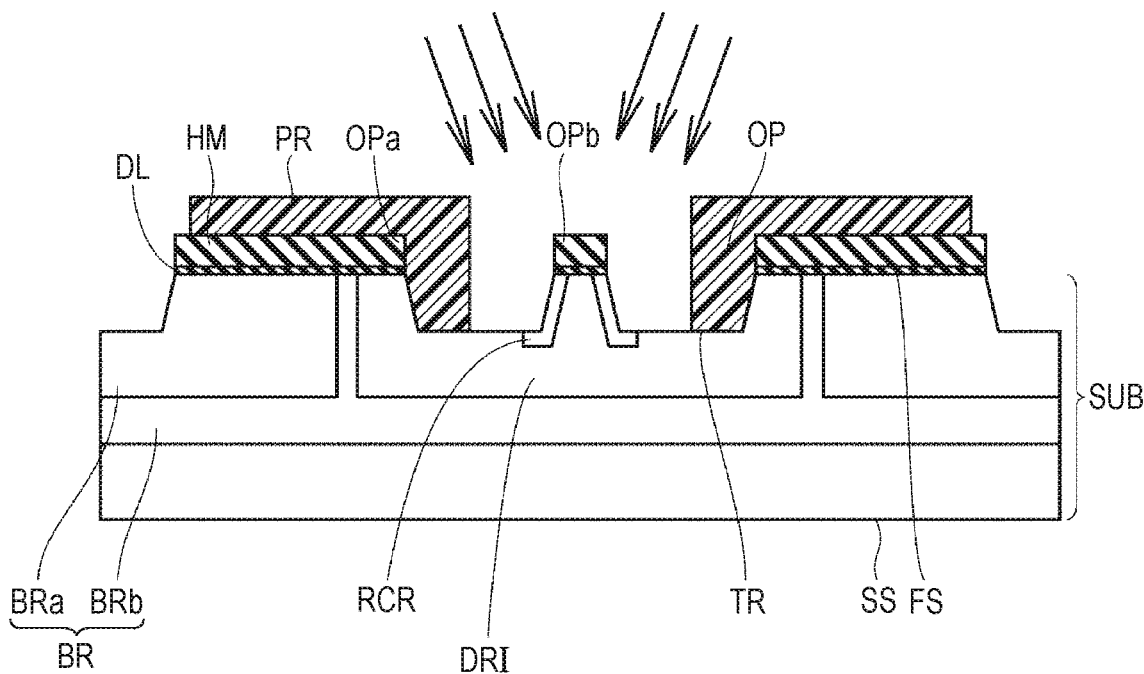
FIG. 29 is a sectional view of the semiconductor device of the second modification of the third embodiment in a second ion implantation step S4.

The method of manufacturing the semiconductor device of the second modification of the third embodiment is the same as the method of manufacturing the semiconductor device of the third embodiment. However, as shown in FIG. 29, the photoresist PR is formed so as not to cover the edge part OPb in the photoresist formation step S3. However, the photoresist PR is formed so as to cover the edge pat OPa in the photoresist formation step S3. Consequently, ion implantation in the second ion implantation step S4 is performed on a side surface, on a side close to the drain region DRA, of the trench TR, and performed on part of the bottom surface, which is continued to the side surface on the drain region DRA side, of the trench TR.

Effects of the semiconductor device and the method of manufacturing the semiconductor device of the second modification of the third embodiment are now described. In the following, differences from the effects of the semiconductor device and the method of manufacturing the semiconductor device of the third embodiment are mainly described, and the same description is not repeated.

In the semiconductor device of the third embodiment, on resistance may increase due to trapping of conductive carriers by interface states at an interface between the isolation film ISL and the drift region DRI. In the semiconductor device of the second modification of the third embodiment, the reverse conductivity region RCR is formed so as to cover the side surface, located on the drain region DRA side, and cover part of the bottom surface, which is continued to the side surface located on the drain region DRA side, of the isolation film ISL, making it possible to suppress such an increase in on resistance due to trapping of conductive carriers by interface states. According to the method of manufacturing the semiconductor device of the second modification of the third embodiment, the reverse conductivity region RCR serving as described above can be accurately formed in a self-aligning manner.

There has been described an exemplary case where one semiconductor device has one LDMOS transistor (one of the LDMOS transistors of the semiconductor device of the third embodiment, the semiconductor device of the first modification of the third embodiment, and the semiconductor device of the second modification of the third embodiment). However, one semiconductor device may have two or more LDMOS transistors selected from the LDMOS transistors of the semiconductor device of the third embodiment, the semiconductor device of the first modification of the third embodiment, and the semiconductor device of the second modification of the third embodiment.

In such a case, the shape of the photoresist PR may be appropriately changed depending on the different types of LDMOS transistors. That is, a photoresist PR having a shape as shown in FIG. 25 may be formed at a position where the LDMOS transistor of the semiconductor device of the third embodiment is formed. A photoresist PR having a shape as shown in FIG. 27 may be formed at a position where the LDMOS transistor of the semiconductor device of the first modification of the third embodiment is formed. A photoresist PR having a shape as shown in FIG. 29 may be formed at a position where the LDMOS transistor of the semiconductor device of the second modification of the third embodiment is formed.

Although the invention achieved by the inventors has been described in detail according to the embodiments hereinbefore, the invention should not be limited thereto, and it will be appreciated that various modifications or alterations thereof may be made within the scope without departing from the gist of the invention.

What is claimed is:

1. A method of manufacturing a semiconductor device, the method comprising the steps of:

forming a first region in a first surface of a semiconductor substrate, a second region having a first portion in the first surface and a second portion in the first surface so as to surround the first portion and the first region;

forming a mask film over the first surface, the mask film having an opening over the first region;

forming a reverse conductivity region in the first surface by ion implantation using the mask film;

forming a trench in the first surface by anisotropic etching using the mask film;

embedding an insulating film in the trench;

forming a source region in the first surface so as to be surrounded by the second region; and forming a drain region in the first surface so as to be surrounded by the first region, and wherein the second region and the reverse conductivity region have a conductivity type opposite to a conductivity type of the source region, the drain region and the first region, wherein the ion implantation is performed obliquely to the first surface such that ions are implanted below a first edge part of the mask film, wherein the first edge part is located on a side of the opening, wherein the side is close to the first portion, wherein, before forming the reverse conductivity region, a photoresist is formed so as to cover a second edge part of the mask film, wherein the second edge part is located opposite to the first edge part with respect to the opening, wherein the reverse conductivity region surrounds the drain region in plan view, wherein the source region surrounds the reverse conductivity region in plan view, wherein the ion implantation is performed through first ion implantation along a first direction in plan view, second ion implantation along a second direction orthogonal to the first direction in plan view, third ion implantation along a third direction opposite to the first direction in plan view, and fourth ion implantation along a fourth direction opposite to the second direction in plan view, and wherein the first direction, the second direction, the third direction, and the fourth direction are each different from an extending direction of the drain region in plan view.

2. The method according to claim 1, wherein the forming the reverse conductivity region is performed before the forming the trench.

3. The method according to claim 1, wherein the forming the reverse conductivity region is performed after the forming the insulating film.

4. The method according to claim 1, wherein the forming the reverse conductivity region is performed after the forming the trench and before the embedding the insulating film.

5. The method according to claim 1, wherein a width of the reverse conductivity region in a channel length direction is smaller than a depth of the insulating film.

6. The method according to claim 5, wherein the width is 0.5 times or more than the depth.

7. The method according to claim 1, wherein the mask film is a hard mask.

8. The method according to claim 1, wherein the first region is a drift region, and wherein the second region is a body region.

* * * * *